United States Patent [19]
Andoh et al.

[11] Patent Number: 5,095,357
[45] Date of Patent: Mar. 10, 1992

[54] INDUCTIVE STRUCTURES FOR SEMICONDUCTOR INTEGRATED CIRCUITS

[75] Inventors: Naoto Andoh; Akira Inoue; Yasuharu Nakajima; Kazuhiko Nakahara, all of Itami, Japan

[73] Assignee: Mitsubishi Denki Kabushiki Kaisha, Japan

[21] Appl. No.: 567,170

[22] Filed: Aug. 14, 1990

[30] Foreign Application Priority Data

Aug. 18, 1989 [JP] Japan .................. 1-213839

[51] Int. Cl.⁵ .................. H01L 27/02; H01L 29/06; H01L 23/48
[52] U.S. Cl. .................. 357/51; 357/40; 357/55; 357/71; 336/200
[58] Field of Search .................. 357/51, 55, 65, 71, 357/40, 27; 336/15, 225

[56] References Cited

U.S. PATENT DOCUMENTS

| | | | |
|---|---|---|---|
| 3,881,244 | 5/1975 | Kendall | 336/200 |
| 4,785,345 | 11/1988 | Rawls et al. | 357/51 |
| 4,833,513 | 5/1989 | Sasaki | 357/65 |

FOREIGN PATENT DOCUMENTS

| | | | |
|---|---|---|---|
| 60-136156 | 9/1985 | Japan . | |
| 61-248545 | 11/1986 | Japan . | |
| 61-294850 | 12/1986 | Japan . | |
| 62-244160 | 10/1987 | Japan | 357/51 |
| 63-140560 | 6/1988 | Japan | 357/51 |
| 63-250165 | 10/1988 | Japan | 357/51 |
| 2-67752 | 3/1990 | Japan | 357/51 |

Primary Examiner—J. Carroll
Attorney, Agent, or Firm—Leydig, Voit & Mayer

[57] ABSTRACT

Inductive structures having low parasitic capacitances for direct integration in semiconductor integrated circuits. In one embodiment, a generally planar spiral winding is disposed on the surface of a substrate. An electrical connection to the internal end of the spiral is made through electrically conducting vias passing through the substrate. The spiral may be spaced from a substrate surface by a plurality of spaced apart electrically conductive posts having a staggered arrangement between adjacent windings of the spiral. A transformer includes two windings disposed on top of each other on a semiconductor substrate and separated by an electrically insulating film. The windings have a common central opening in which a magnetic material is disposed to improve the inductive coupling between the windings. The transformer may include two helical windings, one surrounding another, each formed with vias and electrical conductors, the inner winding being formed in and on a semiconductor substrate and the outer winding being formed on insulating films disposed on the substrate and extending through the films and substrate. A variable inductor includes inductively coupled spiral windings separated by an insulating film and a current control for controlling the current through one of the spirals and, thereby, the effective inductance of the other spiral.

28 Claims, 25 Drawing Sheets

FIG.3(a) PRIOR ART
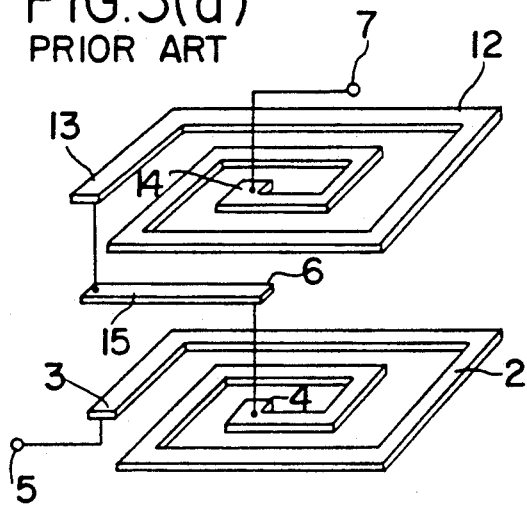
FIG.3(b) PRIOR ART
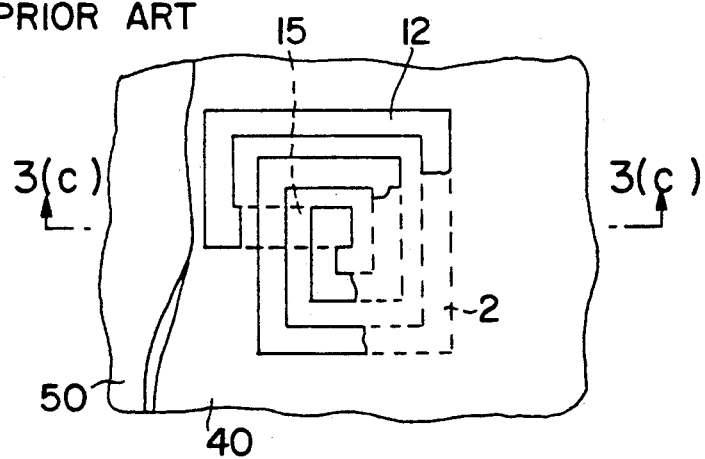
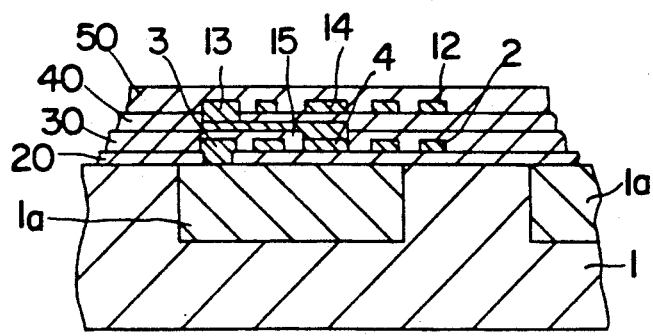
FIG.3(c) PRIOR ART

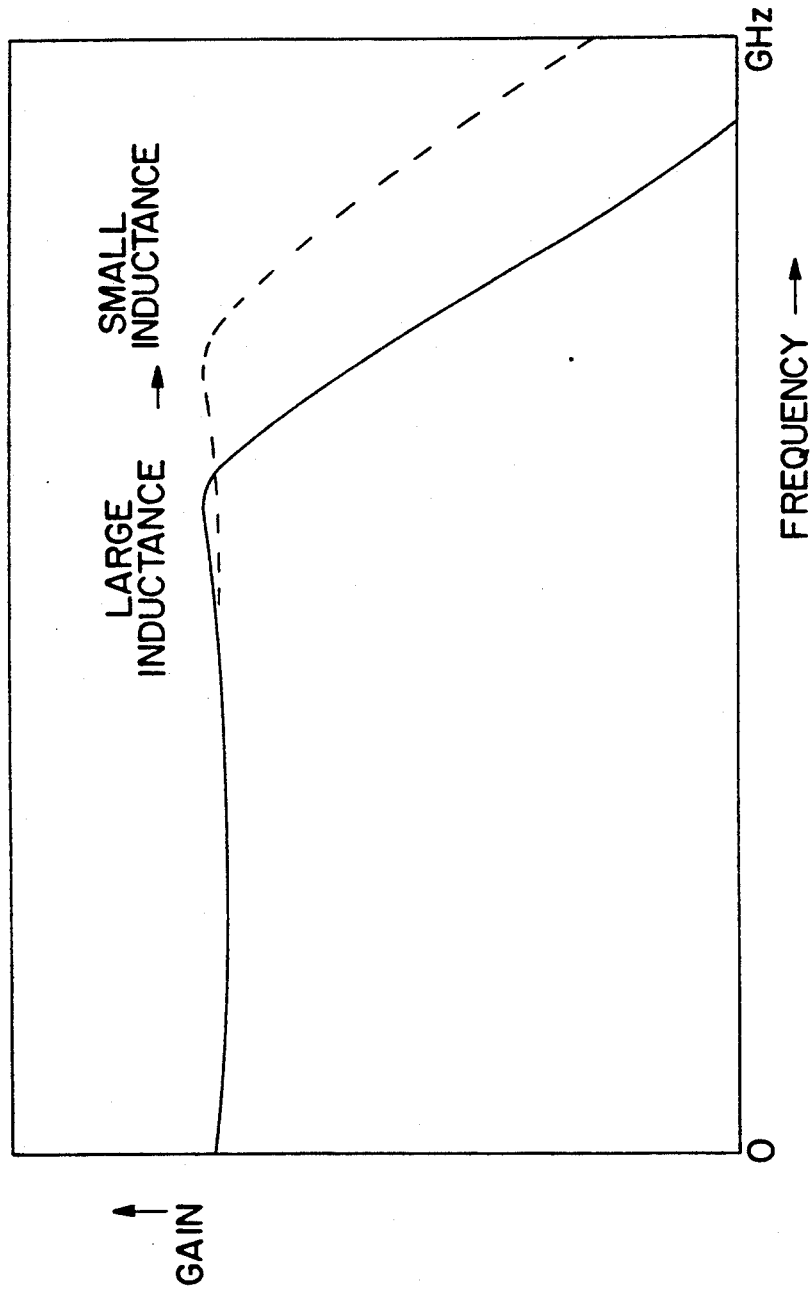

INDUCTIVE STRUCTURES FOR SEMICONDUCTOR INTEGRATED CIRCUITS

FIELD OF THE INVENTION

The present invention relates to inductive structures, such as fixed and variable inductors and transformers, integrable with semiconductor integrated circuits, particularly for use at high frequencies.

BACKGROUND OF THE INVENTION

Of all passive electrical elements (resistors, capacitors, and inductors), inductors are the most difficult to form in integrated circuits. Inductors present difficulties because they require relatively large areas and/or volumes to achieve useful values of inductance. In addition, the traditional three-dimension character of inductors is difficult to realize within integrated circuits that are essentially two-dimensional in character.

The difficulties of making satisfactory inductors of useful values that at integrable with integrated circuits are aggravated at higher frequencies. Because of the limited volumes available for components, i.e., active and passive elements in essentially two-dimensional integrated circuits, the conventional inductive structures suffer from increasing parasitic capacitances at increasing frequencies. These undesirable capacitances are produced by conductor cross overs, closely spaced wiring paths, and the like. The parasitic capacitances adversely affect and limit the frequency at which the circuits perform properly. At high enough frequencies, the effects of the parasitic capacitances can be so strong that they overwhelm the inductive characteristic of an inductance element. In more complex structures, such as transformers, employing several windings, the difficulties associated with controlling the area and volume of an element while achieving desired performance and limiting parasitic capacitances are even greater.

SUMMARY OF THE INVENTION

It is a general object of the present invention to provide inductive structures integrable with semiconductor integrated circuits that have increased inductances and inductive coupling, improved performance, reduced areas and volumes, and reduced parasitic capacitances.

A further object of the invention is the achievement of a transformer integrable in a semiconductor integrated circuit that has a relatively high mutual inductance between its windings while occupying a relatively small area and volume.

Still another object of the invention is provision of an inductive structure having a controllable variable inductance.

According to a first aspect of the invention, the parasitic capacitance of a cross over of conductors in a prior art inductor is avoided by employing in an inductor integrated with an insulating substrate two electrically conducting vias through the substrate. In this aspect of the invention, an electrically conducting spiral is disposed on a surface of the substrate. The spiral includes an external end disposed outside the spiral and an internal end disposed within the spiral. An electrical lead on the first surface of the substrate reaches the internal end of the spiral through the two vias and an electrical conductor on the second surface of the substrate. Another electrical lead on the first surface of the substrate reaches the external lead. The substrate is interposed between the cross over of the lead from the internal end and the spiral, thereby significantly reducing the parasitic capacitance.

In another aspect of the invention, the spiral may be supported above the substrate by a plurality of posts. The posts of adjacent conductors in the spiral are offset so that a post of one winding is disposed intermediate two adjacent posts of an adjacent winding. This spacing reduces the capacitive coupling and the parasitic capacitance between windings and posts that arises in the prior art structures.

A transformer according to the invention includes a first winding disposed on a semiconductor substrate, an insulator disposed on the winding, and a second winding disposed directly on the insulator. The windings and insulator may have a common central opening filled by a magnetic material, such as a ferrite. The presence of a ferrite within the opening of the windings increases the mutual coupling of the winding and transformer performance compared to prior art transformers.

In yet another aspect of the invention, a substrate including a plurality of electrically conducting vias has electrical conductors disposed on its surfaces interconnecting pairs of the vias. The vias and electrical conductors form a first helical winding. Electrically insulating films disposed on opposite sides of the substrate include further vias penetrating the insulating films and the substrate. These vias are interconnected in pairs to form a second helical winding that at least partially surrounds the first winding and is inductively coupled to the first helical winding. A relatively large mutual inductance between the two helical windings in a relatively small volume is achieved.

In a further aspect of the invention, a variable inductance employs two spiral conductors, each including a cross over and disposed on separate substrates. The substrates are separated by an electrically insulating film. Because of the small distance between the spirals, they are inductively coupled. A current flowing through one of the inductors is controlled to control the mutual inductance of the two spirals and, thereby, the effective inductance of the other spiral.

Other objects and advantages of the invention will become apparent from the detailed description given hereinafter. It should be understood, however, that the detailed description and specific embodiments are given by way of illustration only, since various changes and modifications within the spirit and scope of the invention will become apparent to those skilled in the art from the detailed description.

BRIEF DESCRIPTION OF THE DRAWINGS

FIGS. 3(a), 3(b), and 3(c) are perspective, plan, and sectional views, respectively, of a prior art inductor employing two electrically interconnected spirals.

FIG. 20 is a graph of the frequency response of a high frequency amplifier and its modification with a peaking circuit.

DETAILED DESCRIPTION OF PREFERRED EMBODIMENTS

The embodiments of the invention are discussed below in conjunction with representative prior art to illustrate the improvements achieved in the invention. In all figures, like elements are given the same reference numbers.

Figure 1:
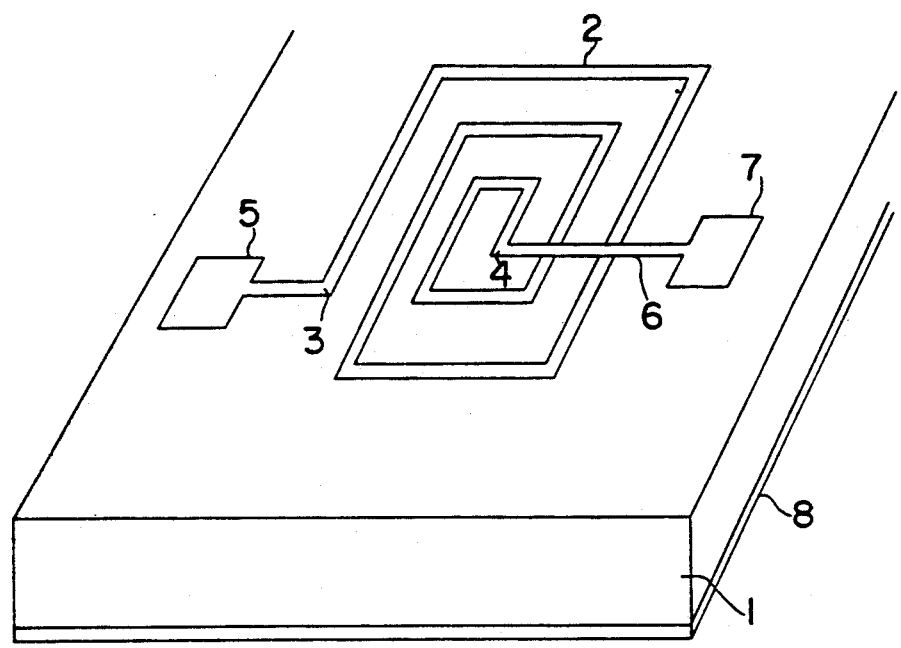
FIG. 1 is a perspective view of a prior art spiral inductor.

FIG. 1 is a perspective view of a prior art inductor disposed on a semiconductor substrate 1 that may be gallium arsenide. In this inductor, an electrical conductor 2 arranged in a spiral pattern is disposed on a first surface of the substrate 1. As used here, the term "spiral" means a winding that increases in diameter with reference to a central point as the conductor becomes longer. The spiral may be smooth, gradually increasing in diameter like the shell of a nautilus, or have corners with angular turns like the ninety degree turns shown in FIG. 1. The spiral is formed of a metal that is deposited by evaporation or by plating and includes an external end 3 lying outside the spiral and an internal end 4 disposed at the inside of the spiral. In FIG. 1, external end 3 is connected to a terminal 5 for ease of connection by wire bonding or other techniques to other circuit components. Internal end 4 is connected through a lead 6 to a terminal 7 for making external connections. Lead 6 must cross over and, therefore, be electrically insulated from windings of the conductor 2. An electrically conducting ground plane 8 is disposed on the opposite side of substrate 1 from the conductor 2.

Figure 2A:
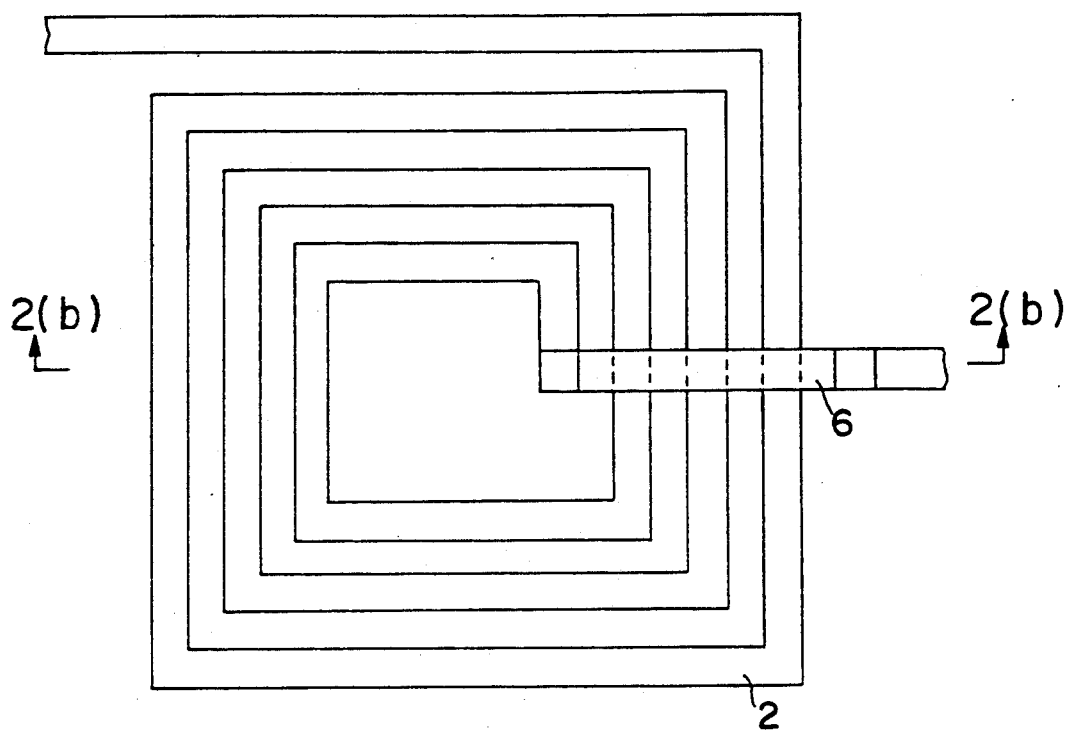
FIGS. 2(a) and 2(b) are plan and sectional views, respectively, of a prior art spiral inductor.
Figure 2B:
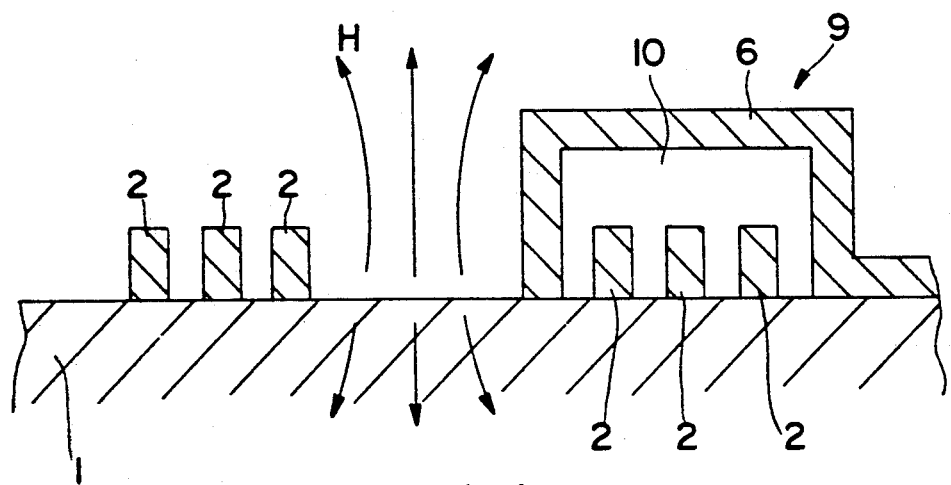

In FIGS. 2(a) and 2(b), a plan view and a sectional view of a prior art inductor similar in structure to the inductor of FIG. 1 is shown. An electrically insulating air bridge 9 including an air space 10 is part of lead 6, providing the electrical insulation from the turns of the conductor 2. The air bridge is formed by conventional technology employing a temporary support, such as a polyimide or photoresist film, covering the windings 2 while the metal comprising air bridge 9 is deposited. After that metal is deposited, the temporary support is removed, for example, with a solvent, leaving a free standing air bridge. In conventional technology, the spacing between the metal of the air bridge and the conductors 2 is, at most, a few microns. Because of this close spacing, even though the dielectric constant of the air between lead 6 and windings 2 is relatively low, a significant parasitic capacitance exists between the windings 2 and the lead 6 at air bridge 9.

In FIGS. 3(a), 3(b), and 3(c), an inductive structure disclosed in Japanese Published Utility Model Application 60-136156 is shown in perspective, plan, and sectional views, respectively. A substrate 1, that may be a semiconductor material, employed with the structure is not shown in FIG. 3(a) for clarity. The inductive structure of FIGS. 3(a)-3(c) includes two spiral electrical conductors 2 and 12 that are disposed opposite each other. The internal end 4 of spiral 2 is electrically connected to an external end 13 of spiral 12 through an electrical conductor 15. The inductive structure has a first terminal 5 electrically connected to the external end 3 of spiral 2 and a second terminal 7 connected to the internal end 14 of spiral 12.

Realization of the inductive structure shown schematically in FIG. 3(a) is indicated in the cross-sectional view of FIG. 3(c). The structure is produced by depositing patterns of metal in conjunction with insulating layers 20, 30, 40, and 50 successively disposed on substrate 1. Initially, after the deposition of insulating layer 20, a window is opened for establishing contact with a highly conductive region 1a in substrate 1. Then, spiral 2 is formed by depositing and patterning a metal. Thereafter, insulating layer 30 is deposited and a window is opened for making a connection to the internal end 4 of spiral 2. After a subsequent metal deposition and patterning to form an interconnection with conductor 15, insulating layer 40 is deposited and a window opened. After still another metal deposition and patterning to form spiral 12, making an electrical connection in the window at the external end 13 of spiral 12, a final, electrically insulating layer 50 is deposited.

The inductance of the structure shown in FIGS. 3(a)-3(c) is the inductance of the individual spirals plus a mutual inductance between the two spirals. Since the mutual inductance between the two spirals is greater than if they were side-by-side, the total inductance is increased over that of two side-by-side spirals and a smaller volume is occupied. However, the fabrication process for the structure of FIGS. 3(a)-3(c) is extremely complex and, as in the prior art device described with respect to FIGS. 2(a) and 2(b), the spacing between the two spirals is limited by the thickness of the insulating layers 20, 30, 40, and 50. Therefore, a significantly increased parasitic capacitance is produced by the structure of FIGS. 3(a)–3(c), limiting its useful frequency range.

Figure 4:
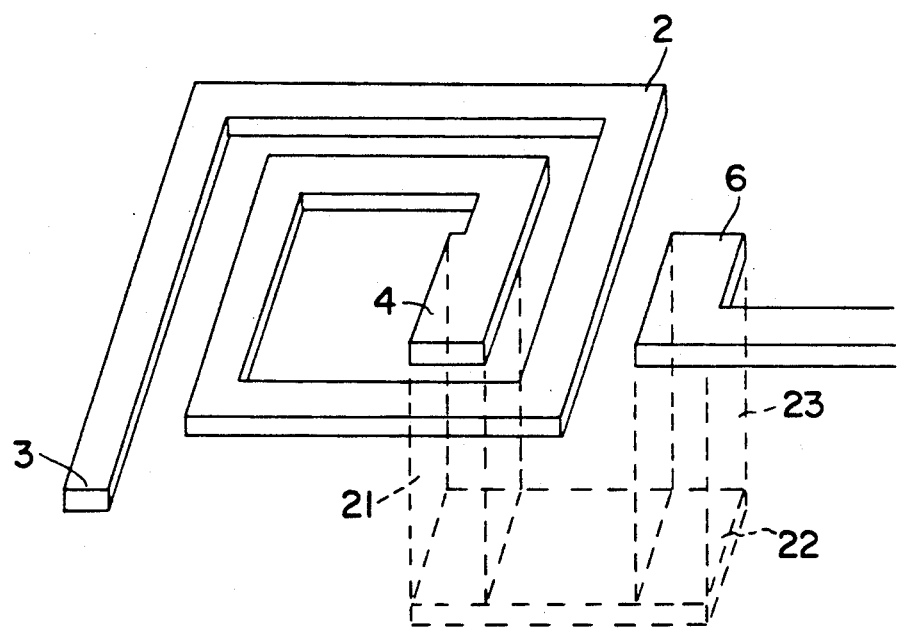
FIG. 4 is a perspective view of a spiral inductor according to an embodiment of the invention.
Figure 5A:
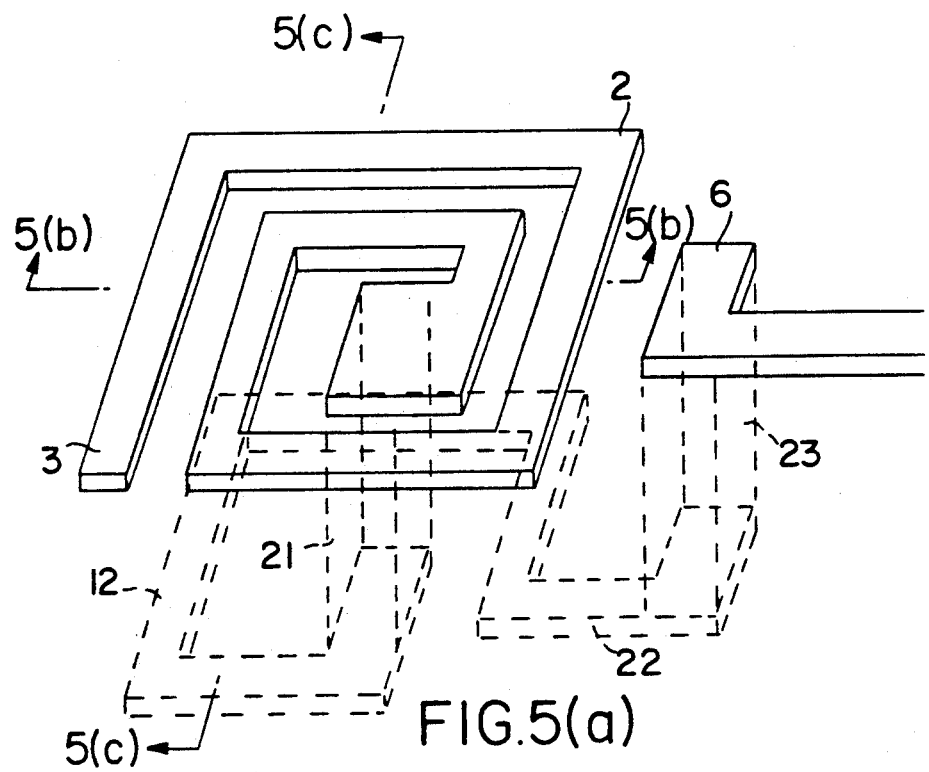
FIGS. 5(a), 5(b), and 5(c) are a perspective and two sectional views, respectively, of a spiral inductor according to another embodiment of the invention.
Figure 5B:
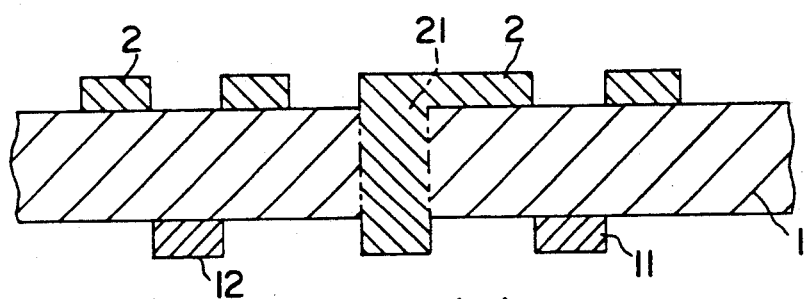
Figure 5C:
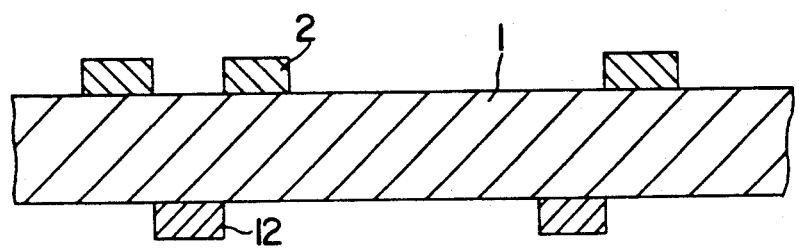

Embodiments of the invention are shown in FIGS. 4 and 5(a)–5(c). In FIG. 4, a perspective, schematic view of an embodiment of the invention is shown in which an intervening substrate 1, illustrated in FIGS. 5(b) and 5(c), is omitted for clarity. Turning to FIG. 4, the inductive structure includes a spiral conductor 2 having an external end 3 and an internal end 4 disposed on a first surface of an electrically insulating substrate (not shown). Internal end 4 is electrically connected to a lead 6 not by an air bridge structure but by a via and lead arrangement. A via 21 includes a via hole penetrating the substrate 1 from the surface of the substrate on which spiral 2 is disposed to the opposite surface of the substrate and an electrically conductive material filling the via hole. An electrical conductor 22 is disposed on the opposite surface of the substrate from the spiral 2 and is in electrical contact with via 21. A second electrically conducting via 23 outside spiral 2 also penetrates the substrate. That via 23 is in electrical contact with conductor 22 and with lead 6 so that an external electrical connection can be made to internal end 4 of spiral 2 from the side of the substrate on which spiral 2 is disposed.

The embodiment of the invention shown in FIGS. 4 and 5(a)–5(c) is produced by conventional techniques including preparing the via holes, filling them with metal to complete the vias, and subsequently depositing and patterning electrical conductors on both sides of the substrate to complete the electrical connections. These processing steps can be carried out in various orders. For example, the spiral conductor 2 can be deposited and patterned first, the via holes then produced and filled with metal, and the structure completed by depositing and patterning conductor 22 at the rear surface of the substrate. The substrate 1 may be an electrically insulating or semi-insulating semiconductor, such as gallium arsenide or indium phosphide, but is not limited to semiconductor materials. When the substrate is a semiconductor, gallium arsenide is preferred for high frequency applications. Substrate 1 may also be a conventional dielectric substrate, such as sapphire, spinel, and the like. It is only important that the substrate be sufficiently electrically insulating that the inductive structure is not short-circuited.

The invention has the advantage that it can be directly integrated into a semiconductor integrated circuit. The semi-insulating semiconductor substrate on which the spiral is disposed and in which the vias are formed may have formed on and in it active components, such as transistors and diodes, and other passive elements, together forming an integrated circuit.

In the embodiment of the invention shown in FIGS. 5(a)–5(c), a second electrically conducting spiral 12 is disposed on the surface of the substrate opposite the surface bearing spiral 2. As in the embodiment of the invention shown in FIG. 4, the internal end of spiral 2 disposed on the first surface of the substrate 1 is electrically connected by means of a via 21. In the embodiment of FIGS. 5(a)–5(c), via 21 extends through the substrate 1 and is electrically connected to the second spiral 12. Spiral 12 is connected to a lead 6 through a second via 23.

An important feature of the structure of FIGS. 5(a)–5(c) is the sense, i.e., the direction of turning of the spirals 2 and 12. Spirals 2 and 12 in the embodiment of FIGS. 5(a)–5(c) have different senses, i.e., one is wound in a left-hand sense and the other is wound in a right-hand sense. In addition, spiral 12 is disposed, where possible, so that it does not directly underlie spiral 2. Obviously, the internal end 14 of spiral 12 directly underlies the internal end 4 of spiral 2, and a portion of spiral 12 or conductor 22 passes beneath part of spiral 2 to reach via 23. Otherwise, in the embodiment of FIGS. 5(a)–5(c), if spiral 12 is projected onto the surface of the substrate bearing spiral 2, there is no overlapping of spirals 2 and 12 except at the via 23 and the cross over. In other words, the spirals 2 and 12 are interleaved. This arrangement minimizes the parasitic capacitance between the two spirals. The embodiment of FIGS. 5(a)–5(c) is produced in the same manner that the embodiment of FIG. 4 is produced.

The embodiment of the invention shown in FIGS. 5(a)–5(c) provides increased inductance over that of FIG. 4 by the inclusion of second spiral 12. However, there is no significant increase in parasitic capacitance because spiral 12 does not directly underlie spiral 2 any more than conductor 22 of FIG. 4 does. Moreover, the fabrication process is no more complex than that of the structure of FIG. 4 and far less complex than that of the prior art structure of FIGS. 3(a)–3(c).

In the embodiments of the invention shown in FIGS. 4 and 5(a)–5(c), the substrate 1, which may be a semiconductor substrate, is disposed between the spiral 2 and conductor 22 and, as indicated in FIGS. 5(a)–5(c), the second spiral 12. The relatively large thickness of the substrate, particularly when compared to the relatively thin insulating layers of the prior art inductive structure of FIG. 3(c), significantly reduces the parasitic capacitance of the novel structure. The dielectric constant of air employed in the air bridge 9 of the prior art structure shown in FIG. 2(b) is one whereas for a semiconductor substrate 1, such as gallium arsenide, the dielectric constant is about twelve. However, the increase in the spacing between the conductors in the invention, hundreds of microns versus a few microns in the air bridge structure of FIGS. 2(a)–2(b), results in a substantial reduction in the parasitic capacitance in the invention.

Figure 6A:
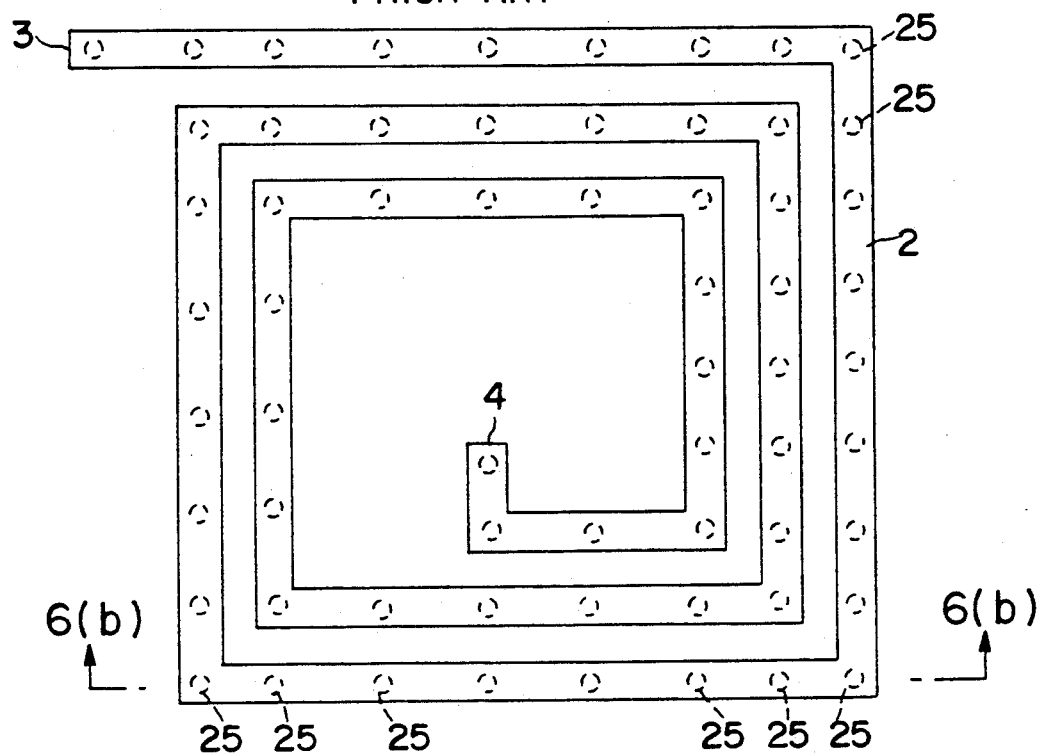
FIGS. 6(a) and 6(b) are plan and sectional views, respectively, of a prior art spiral inductor.
Figure 6B:
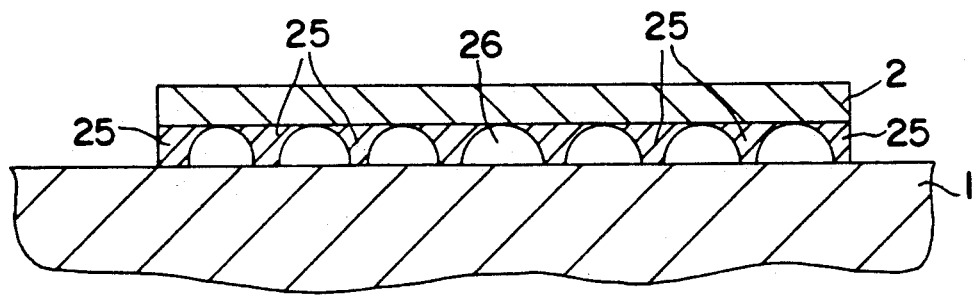

A known method of reducing the parasitic capacitance of a planar spiral inductive structure is illustrated in FIGS. 6(a) and 6(b). There, in plan and cross-sectional views, an electrically conducting spiral 2 is supported above the surface of a substrate 1 by a plurality of electrically conductive posts 25. The metal posts 25 are spaced apart from each other by air spaces 26. The dielectric constant of air is about one and is smaller than that of the underlying substrate, for example, twelve, when the substrate is gallium arsenide. The supporting structure of FIGS. 6(a) and 6(b) reduces the capacitance between adjacent windings of spiral 2, effectively changing the dielectric constant between the windings from twelve to one. However, some parasitic capacitance is added by the posts 25.

Figure 7A:
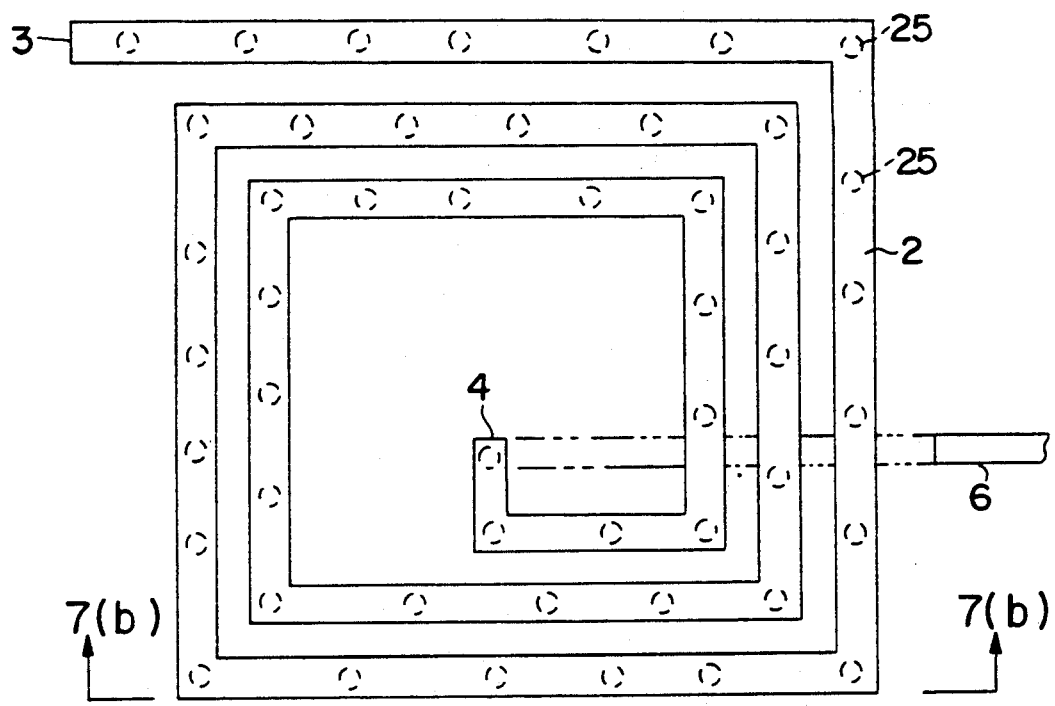
FIGS. 7(a) and 7(b) are plan and sectional views, respectively, of a spiral inductor according to an embodiment of the invention.
Figure 7B:
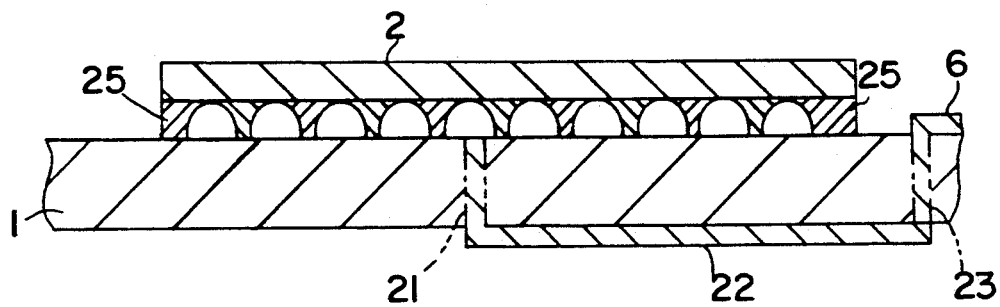

FIGS. 7(a) and 7(b) show in plan and sectional views a modification of the supporting structure of FIGS. 6(a) and 6(b) that results in still further reduced parasitic capacitance. That supporting structure may be employed independently or in combination with the embodiments of the invention shown in FIGS. 4 and 5(a)–5(c). In FIGS. 6(a) and 7(a), the supporting posts 25 are electrically conducting and support the spiral 2 at a distance from the surface of substrate 1. In FIG. 6(a), each post 25 has at least one neighbor directly opposite it in an adjacent winding. In other words, in FIG. 6(a), each pair of adjacent posts 25 supporting one winding has a corresponding pair of adjacent posts in an adjacent winding with the respective posts in each winding aligned with each other. However, in the embodiment of the invention shown in FIG. 7(a), for each pair of adjacent posts supporting one winding, there is, in an adjacent winding, a supporting post intermediate those two adjacent posts. That arrangement, as shown in FIG. 7(a), results in a zig-zag pattern of posts in adjacent windings. Assuming the posts have the same spacing interval for each winding in FIG. 6(a) and 7(a), the spacing arrangement of FIG. 7(a) increases the distance between posts of adjacent windings by the square root of two. Thus, the parasitic capacitance between adjacent windings is reduced.

As illustrated in FIGS. 7(a) and 7(b), the vias 21 and 23 and an electrical conductor 22, all as shown and described with respect to FIG. 4, can be employed with the novel supporting post structure. The reduced capacitance of the novel supporting structure permits an inductive structure according to the invention to be employed at higher frequencies from prior art structures without being degraded by parasitic capacitance.

Figure 8:
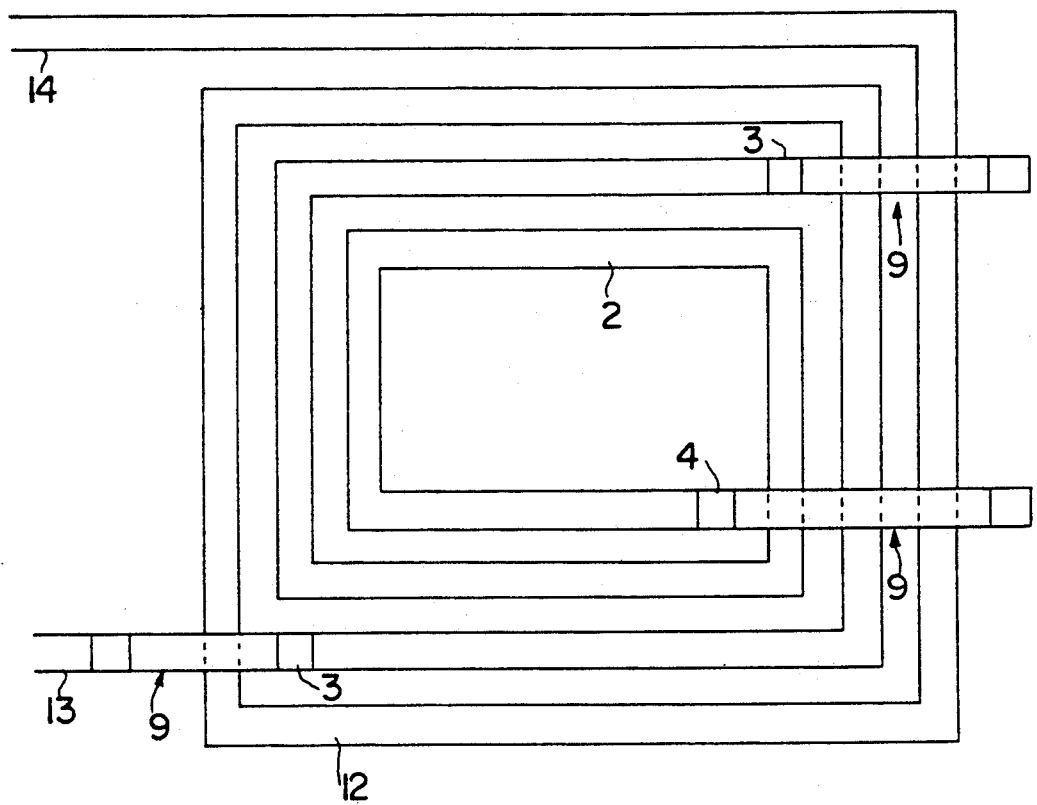
FIG. 8 is a plan view of a prior art transformer employing two spiral inductors disposed on the same surface.

Multiple spiral windings that are inductively coupled to each other can be employed as transformers. An example of a prior art transformer employing two spiral windings disposed on the same surface is shown in plan view in FIG. 8. There, an electrically conducting spiral 2 is disposed within an electrically conducting spiral 12. Both the external end 3 and the internal end 4 of spiral 2 require air bridge structures 9, insulating them from and crossing over windings of spiral 12 and giving electrical access to the spiral 2. Because spiral 12 lies outside spiral 2, direct access to external end 13 of spiral 12 is available. However, an air bridge structure 9 must still be provided to give external access to the internal end 14 of spiral 12. Because of the presence of the three air bridges 9, the transformer of FIG. 8 suffers from the same parasitic capacitance problems described for the other prior art spiral inductive structures. In addition, the magnetic coupling between spirals 2 and 12 is limited because only a relatively low permeability material, i.e., the substrate 1, is present in the vicinity of those windings.

Figure 9:
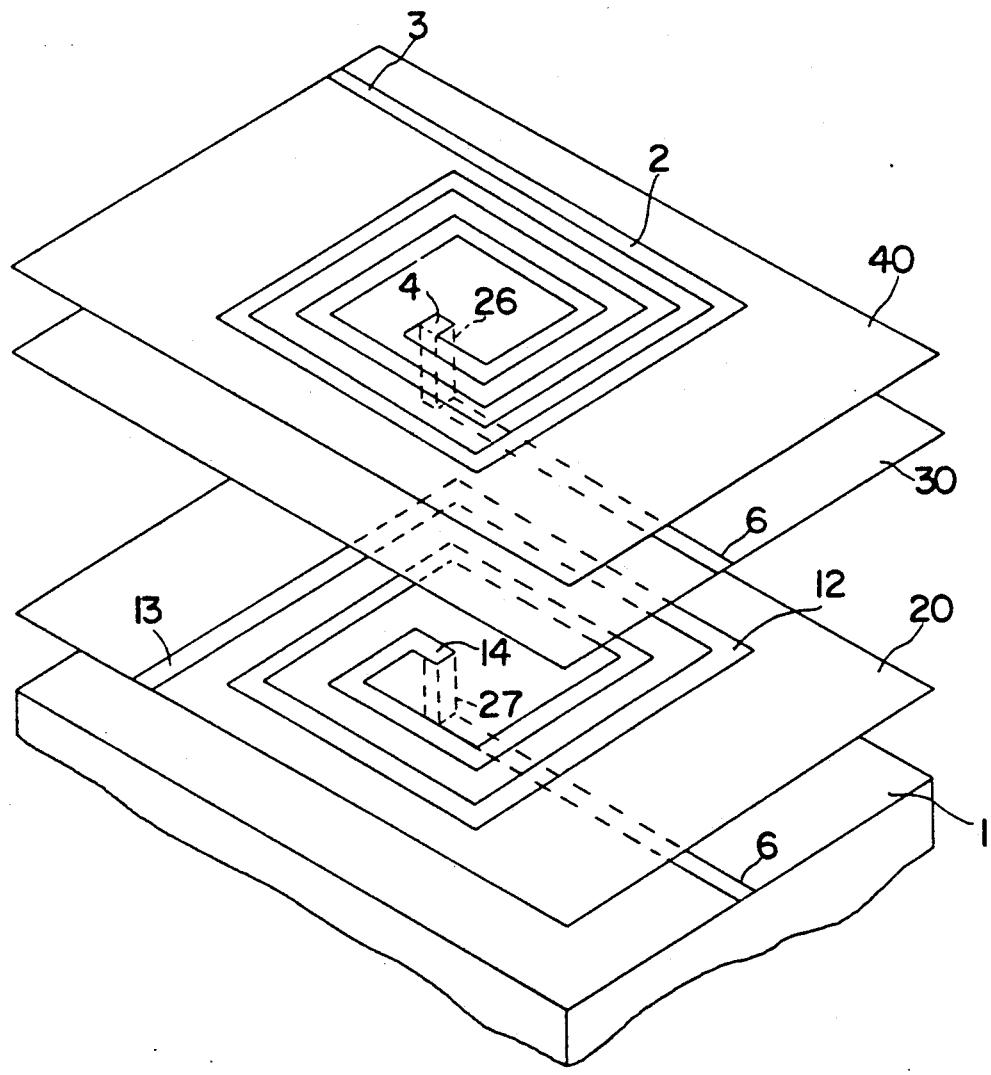
FIG. 9 is a perspective view of a prior art transformer employing two spiral inductors disposed on different surfaces with an intervening insulating film.

Another prior art transformer structure is shown in an exploded view in FIG. 9. That transformer structure includes an electrically insulating substrate 1 on which insulating films 20, 30, and 40 are successively disposed. Electrically conducting spirals 2 and 12 are respectively disposed on films 20 and 40. Each of the films includes a through hole through the respective insulating films through which conductors 26 and 27 respectively extend to an underlaying layer, film 30 in the case of spiral 2 and substrate 1 in the case of spiral 12. These electrical conductors passing through the insulating films provide an electrical connection to respective leads 6 from the internal ends 4 and 14 of spirals 2 and 12. The two spirals 2 and 12 have the same sense, i.e., the same direction winding, and overlie each other to maximize their mutual inductive coupling. The mutual inductances of the two spirals is controlled by their geometries with respect to each other and the thicknesses of the insulating films. However, the mutual inductance between the two spirals is limited since the permeability of the adjacent materials is relatively small.

Figure 10A:
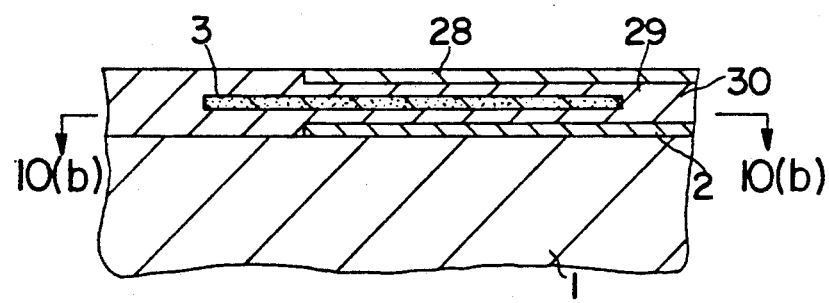
FIGS. 10(a), 10(b), and 10(c) are a sectional view, and two plan views, respectively, of a prior art transformer employing a magnetic sheet between coils.
Figure 10B:
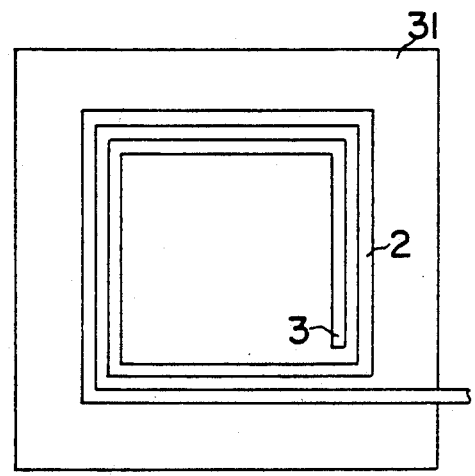
Figure 10C:
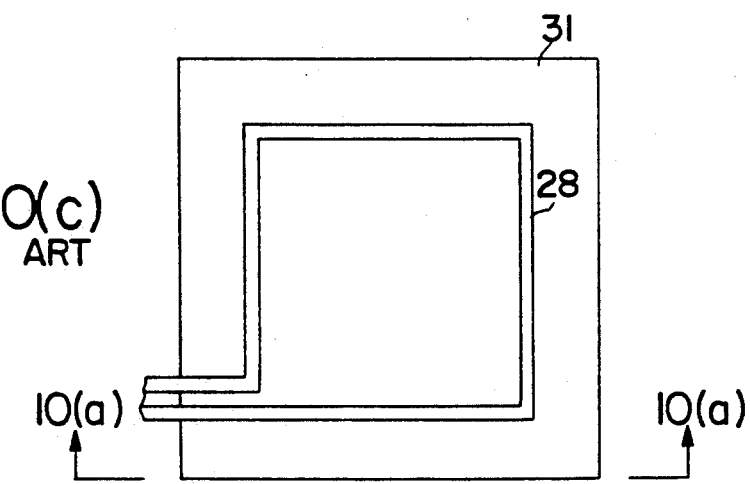

In FIGS. 10(a)–10(c), another prior art transformer structure for use in semiconductor integrated circuits is shown in sectional and plan views. This transformer employs a sheet of a relatively high permeability material in order to improve the inductive coupling between two windings. In this prior art structure, described in Japanese Published Patent Application 61-29485, an electrically conductive spiral 2 is disposed on an electrically insulating substrate 1. A second winding 28 comprises a single turn loop spaced from spiral 2 by an electrically insulating layer 30. A ferromagnetic sheet 31 is embedded in the insulating layer 29 between spiral 2 and winding 28. Because the ferromagnetic sheet 31 is disposed between spiral 2 and winding 28 rather than within their central openings, it is not effective in significantly increasing the inductive coupling between those two conductors. Thus, it is difficult in the prior art structures to obtain a large mutual inductance and high efficiency in the transformer.

Figure 11A:
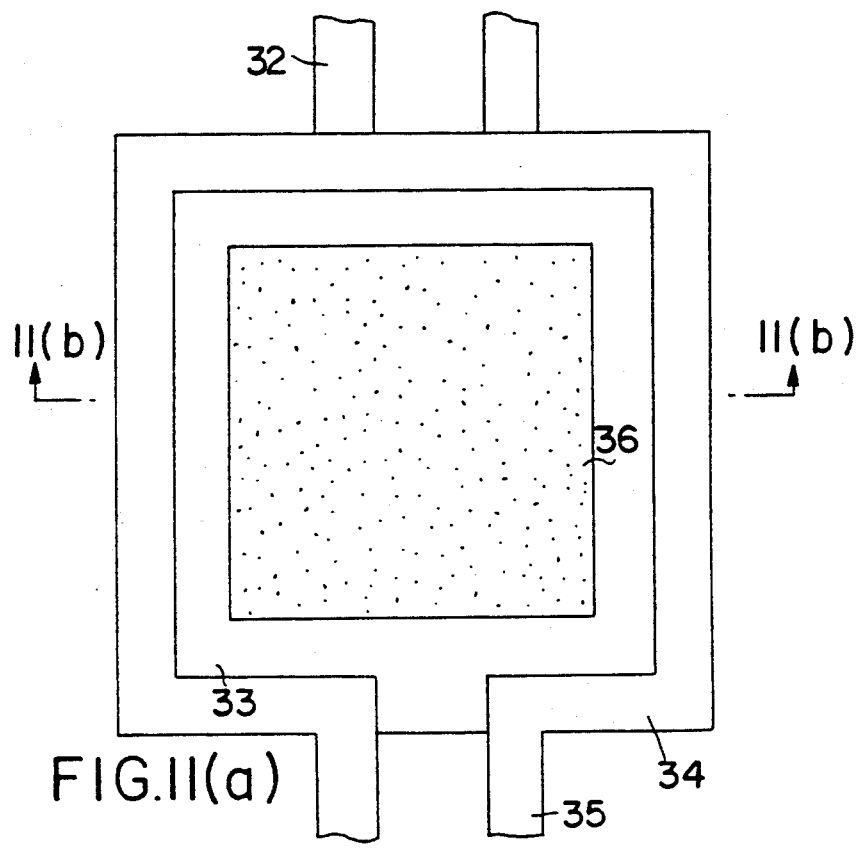
FIGS. 11(a), 11(b), and 11(c) are plan, sectional, and perspective views, respectively, of a transformer according to the invention.
Figure 11B:
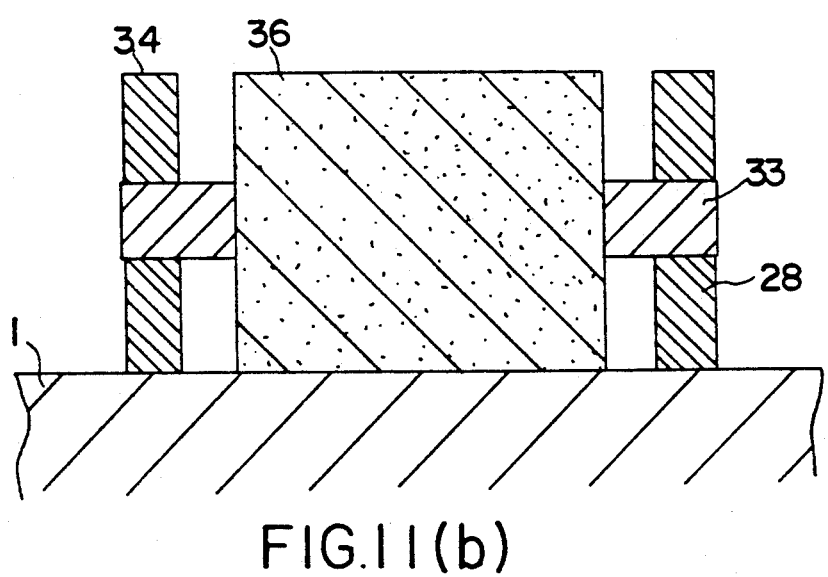
Figure 11C:
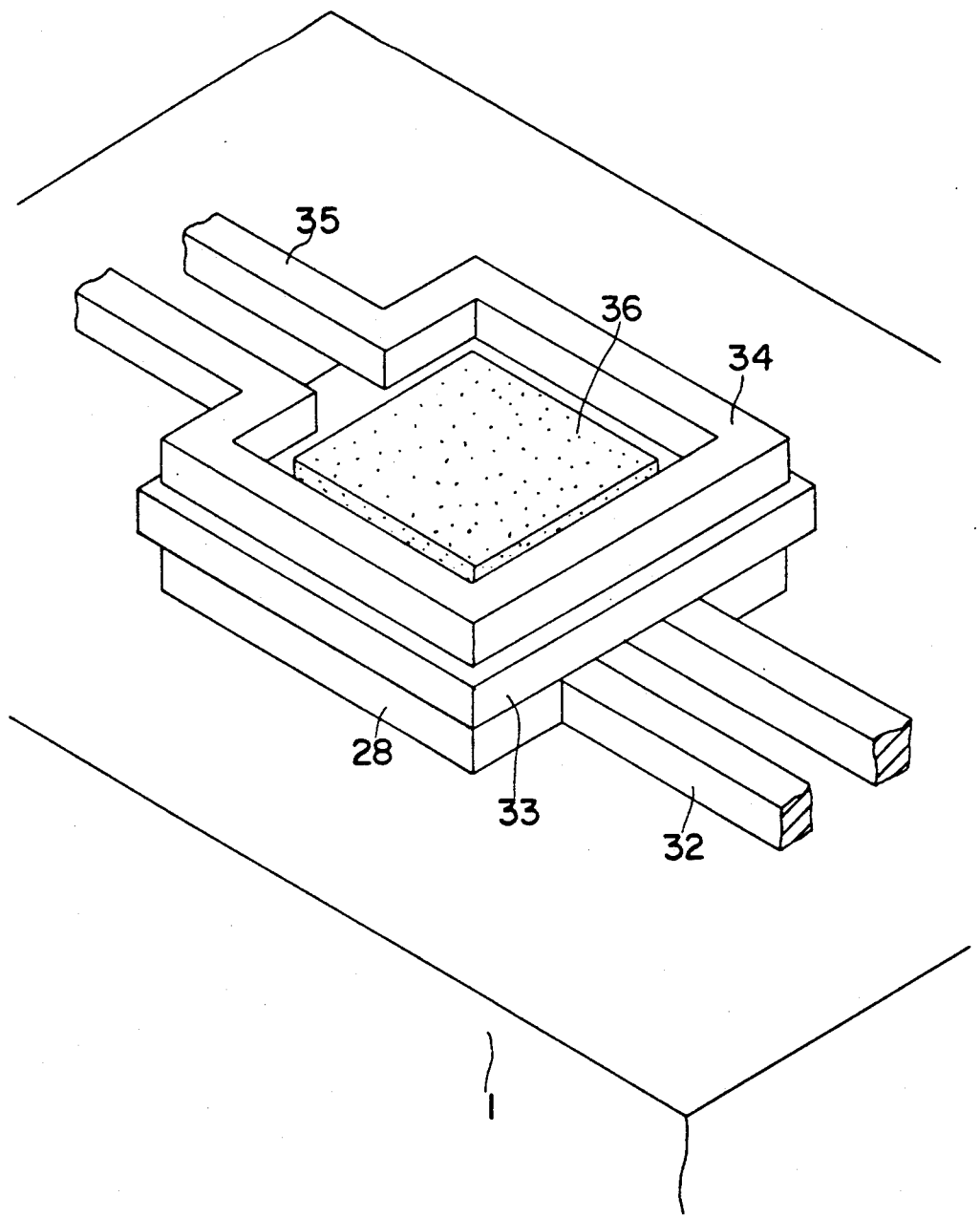

FIGS. 11(a), 11(b), and 11(c) are plan, sectional, and perspective views, respectively, of a transformer integrable in a semiconductor integrated circuit according to an embodiment of the invention. In this structure, a single turn winding 28 made of a thin metal film is disposed on the surface of a semiconductor substrate, such as gallium arsenide. Winding 28 includes a pair of leads 32. An electrically insulating film 33, such as SiN or SiON, is disposed on winding 28. Another single turn winding 34 is disposed on insulator 33 directly above and opposite winding 28. Winding 34 includes leads 35. Windings 28 and 34 and insulating film 33 have common central openings generally aligned with each other to provide a common core. A ferromagnetic body 36, such as a ferrite, is disposed within that common central opening to improve the mutual inductance of windings 28 and 34. The magnetic permeability of body 36 is significantly larger than that of substrate 1. Moreover, the disposition of that magnetic body within the common core of the two windings 28 and 4 ensures good magnetic coupling between those windings. As a result, a relatively high mutual inductance, i.e., a highly efficient transformer, is achieved according to this embodiment of the invention. As well known in the art, the permeability of ferrite materials may be about twenty-five hundred, providing very strong coupling between the two windings 28 and 34. As illustrated in FIGS. 11(a) and 11(c), the leads 32 and 35 of the respective windings are preferably aligned in different directions to avoid undesired capacitive coupling between them.

The structures of FIGS. 11(a)–11(c) are readily constructed using conventional semiconductor device techniques, such as patterning of metal and insulating layers with photolithography, and can be made part of integrated circuitry on a substrate including interconnected active and passive circuit elements. The ferromagnetic body 36 may be separately formed and disposed in the common central opening of the windings and insulating film 33. Alternatively, the ferromagnetic material may be deposited in the common opening of the windings and insulating layer by silk screening or other deposition techniques, followed by curing and/or other steps necessary to produce the desired ferromagnetic properties. Preferably, the ferromagnetic material is deposited after both windings 28 and 34 and insulating film 33 have been deposited and patterned.

Figure 12A:
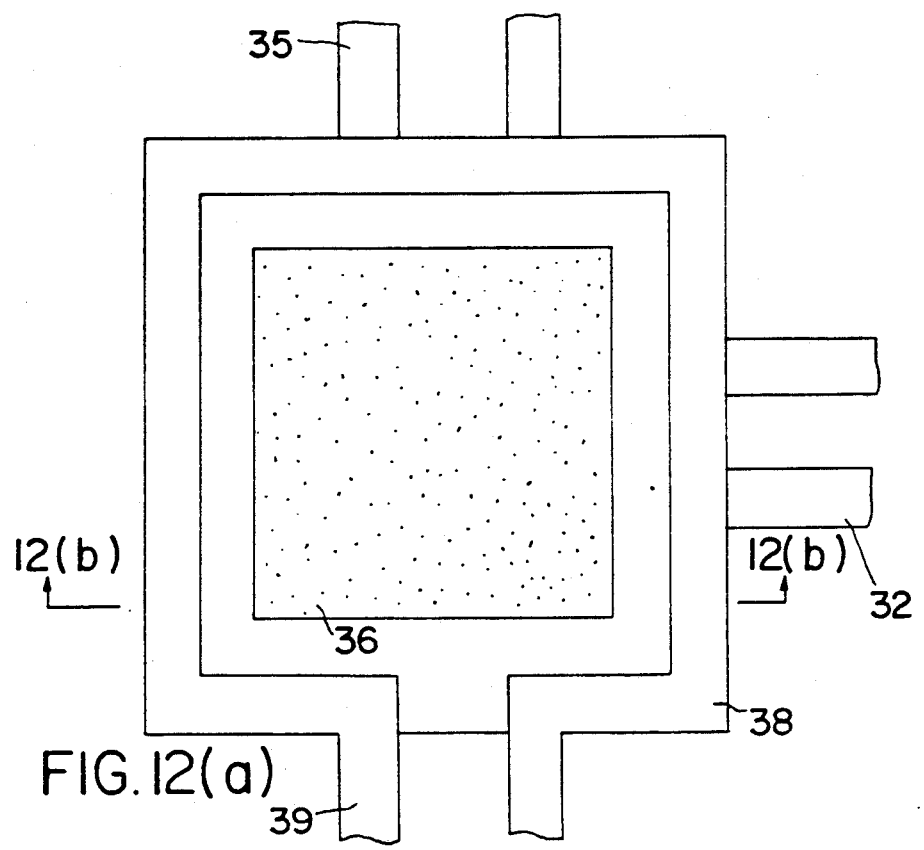
FIGS. 12(a), 12(b), and 12(c) are plan, sectional, and perspective views, respectively, of a transformer according to the invention.
Figure 12B:
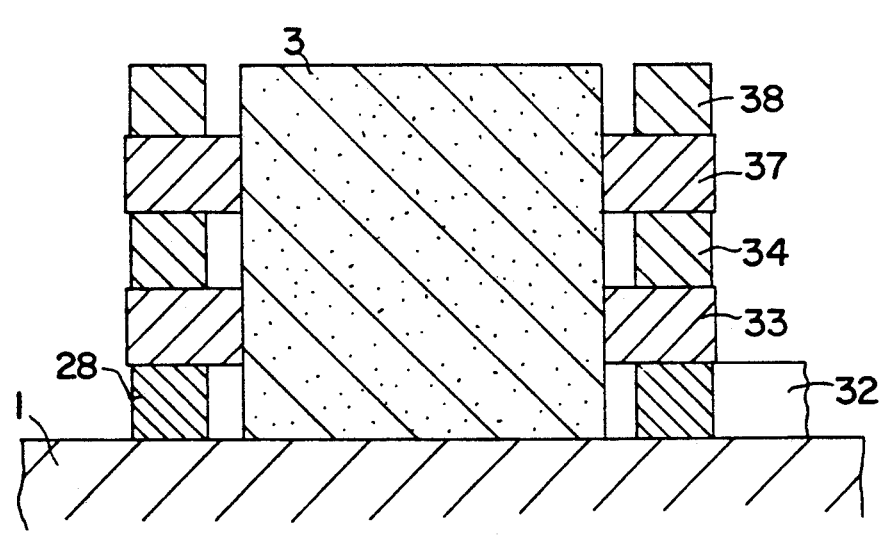
Figure 12C:
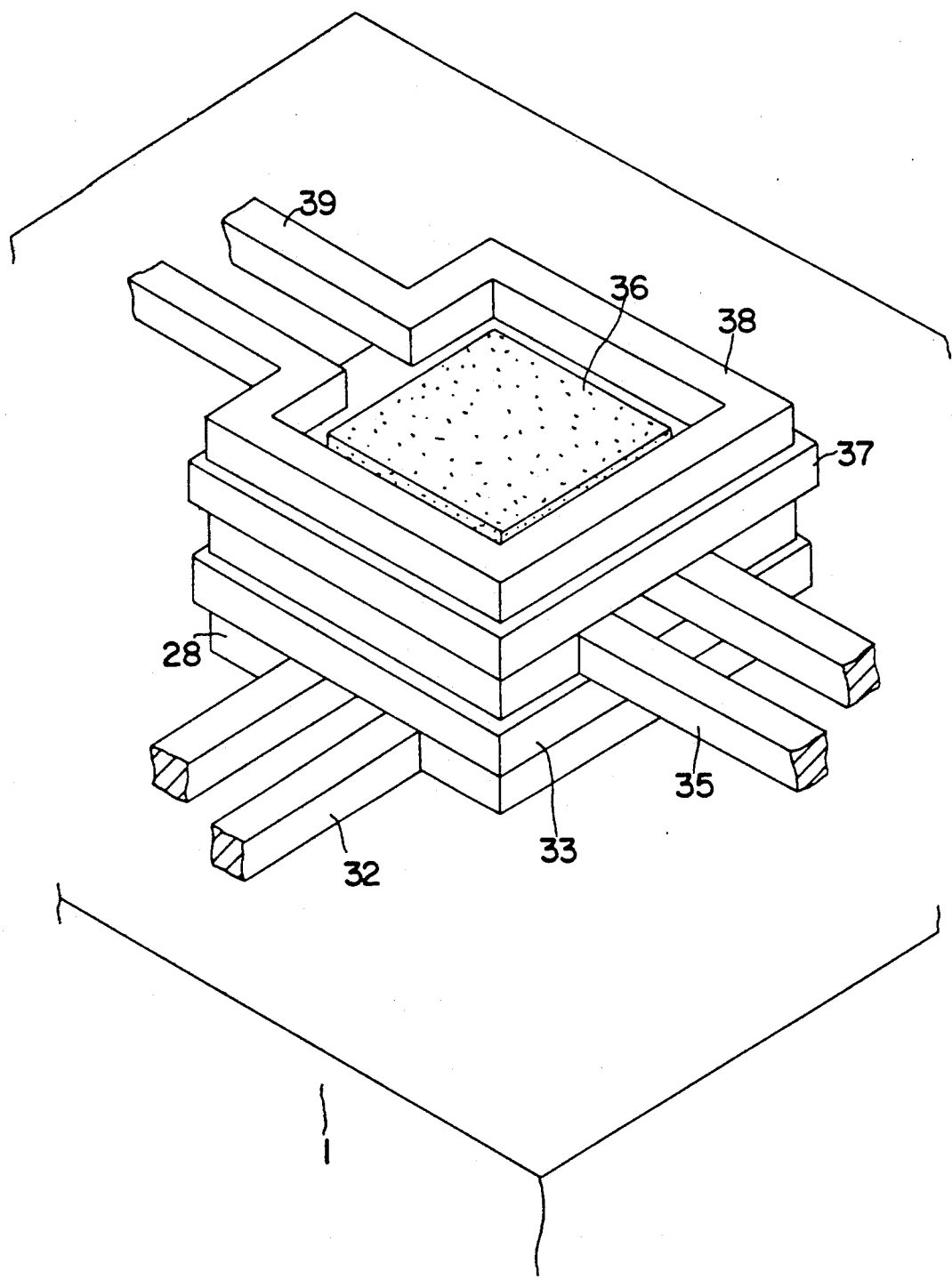

In FIGS. 12(a), 12(b), and 12(c), an extension of the structure shown in FIGS. 11(a)–11(c) is shown in plan, sectional, and perspective views, respectively. The structure of FIGS. 12(a)–12(c) is identical to that of 11(a)–11(c) except that a second insulating film 37 is disposed on winding 34 and a third winding 38 is disposed on insulating film 37. This third winding 38 includes leads 39. The leads of each of the three windings are oriented along different directions. The magnetic body 36 is extended in height to fill the common core of the three windings and two intervening insulating layers. Additional windings and insulating films can be added to the stack. This embodiment is produced in the same manner that the embodiment of FIGS. 11(a)-11(c) is prepared except that additional steps are required for depositing the second insulating film 37 and electrical conductor forming winding 38. The same desirable large mutual inductive coupling is obtained as in the earlier embodiment except that the coupling occurs between three windings rather than two. In these structures, the direction of mutual coupling is generally perpendicular to the surface of substrate.

Since monolithic integrated circuit technology makes single turn transformer windings the easiest to fabricate, integrable transformers inherently have low inductances and low mutual inductances between windings. In the invention, the mutual inductance and transformer efficiency of single turn windings are significantly increased, even compared to the prior art structure of FIG. 10(a), since the ferromagnetic material is disposed very close to the transformer windings.

Another transformer embodiment according to the invention is shown in FIGS. 13(a)-13(e). This transformer embodiment incorporates a first generally helical coil 47 surrounded by a second generally helical coil 48. The term "helical" as used here refers to a three-dimensional winding much like a wire wound around a spool along the length of the spool. However, the term as used here encompasses a winding that includes corners along its length.

Figure 13A:
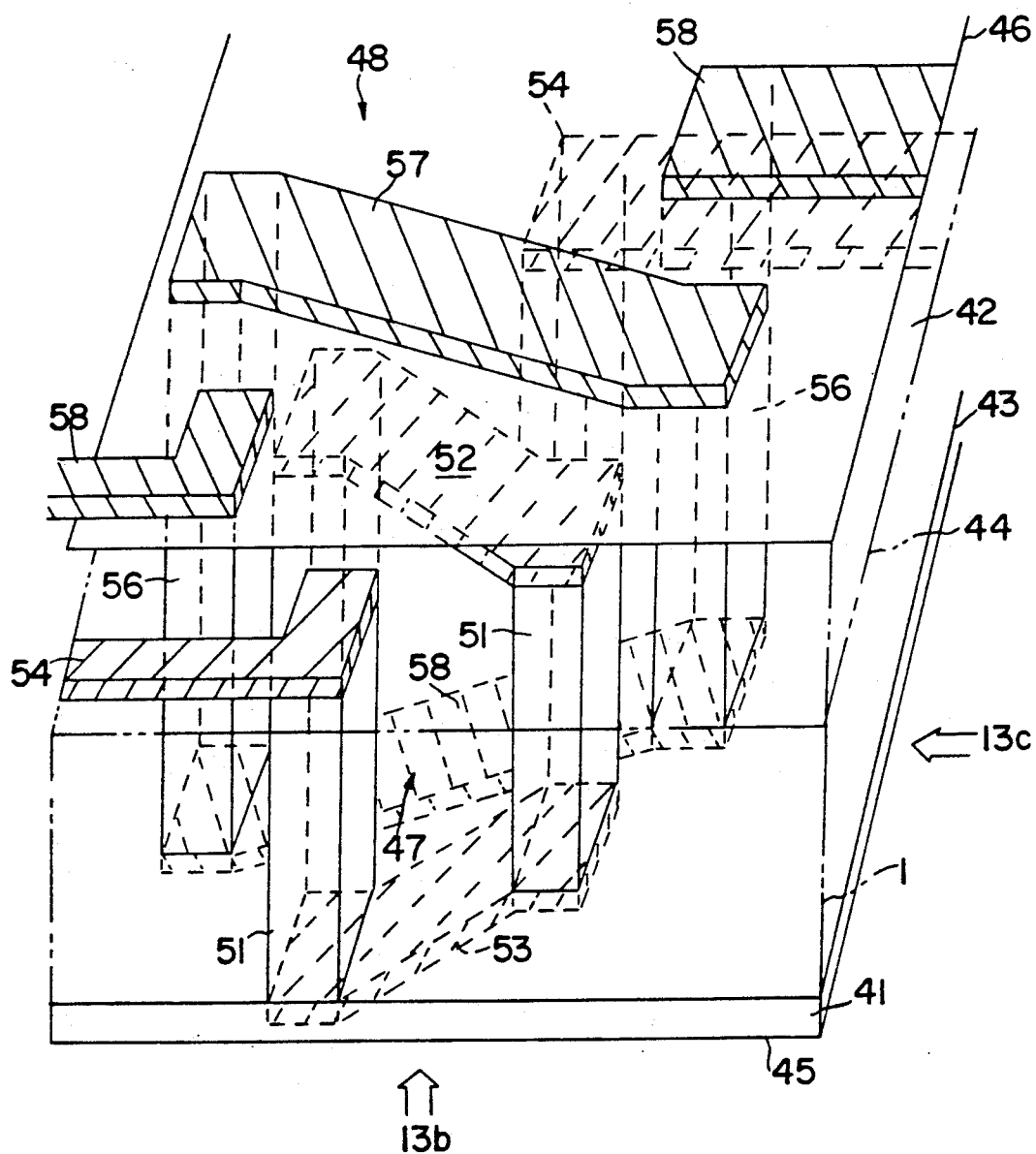
FIGS. 13(a), 13(b), 13(c), 13(d), and 13(e) are a perspective views, two side views, a partial exploded view, and another partial view, respectively, of a transformer according to an embodiment of the invention.
Figure 13B:
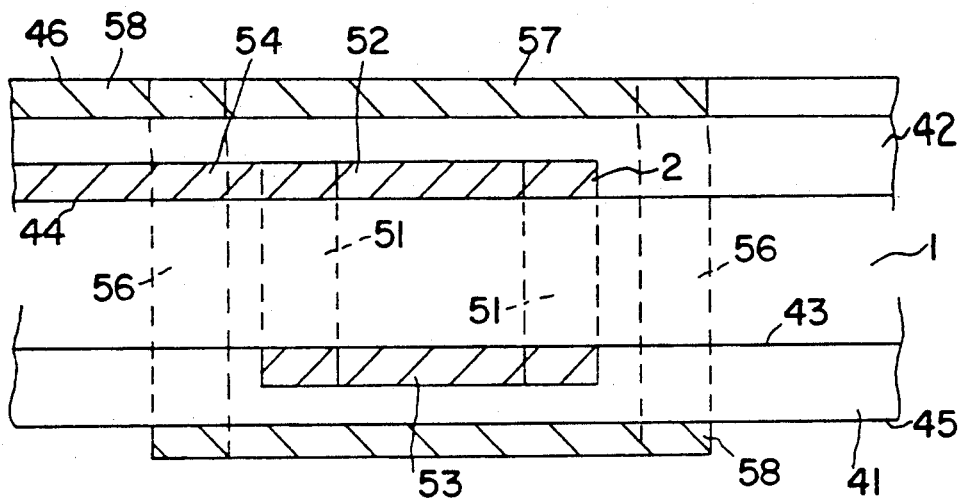
Figure 13C:
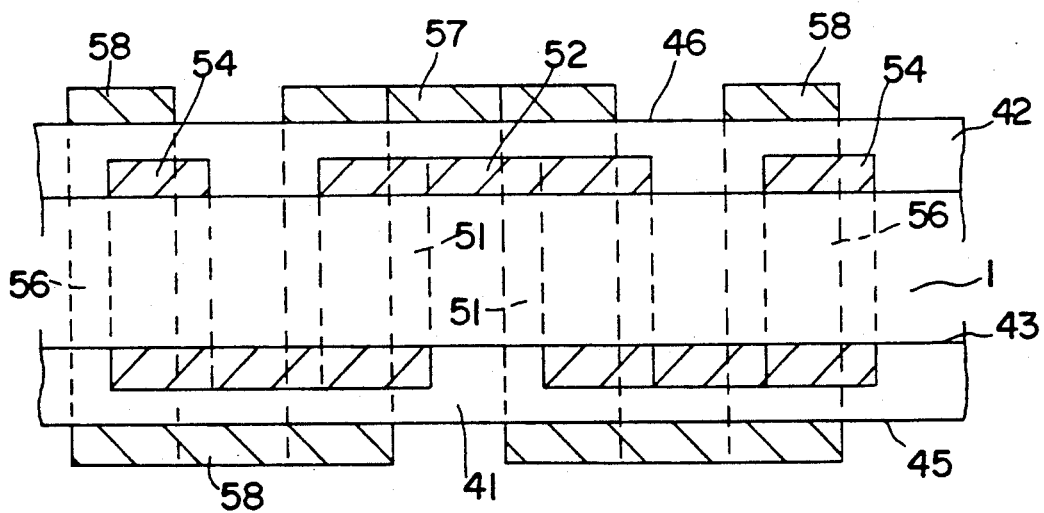

FIG. 13(a) shows a perspective view of an embodiment of the invention and FIGS. 13(b) and 13(c) show side views of the structure of the FIG. 13(a). These views include a large number of phantom lines and overlapping elements which may be more easily understood by reference to FIGS. 13(d) and 13(e). Turning initially to FIG. 13(e), an electrically insulating substrate 1 includes a plurality of vias 51 that penetrate the substrate from a surface 43 to a surface 44 and are filled with an electrically conducting material, such as a metal. Substrate 1 may be a semiconductor, such as gallium arsenide or indium phosphide. Pairs of vias are electrically connected on surface 43 of substrate 1 by electrical conductors 53. Likewise, in the embodiment shown in FIG. 13(e), an electrical conductor 52 disposed on surface 44 of the substrate electrically connects two of the vias on surface 44. The substrate 1 of FIG. 13(e) includes four vias 51, but a larger number could be employed in the invention in which case more conductors 52 on surface 44 would be employed. Two of the vias 51 are connected to respective leads 54 disposed on surface 44. Thus, as is apparent from FIG. 13(e), a helical, inductive structure, much like a wound coil, as shown in FIG. 13(e) is initially prepared.

Figure 13D:
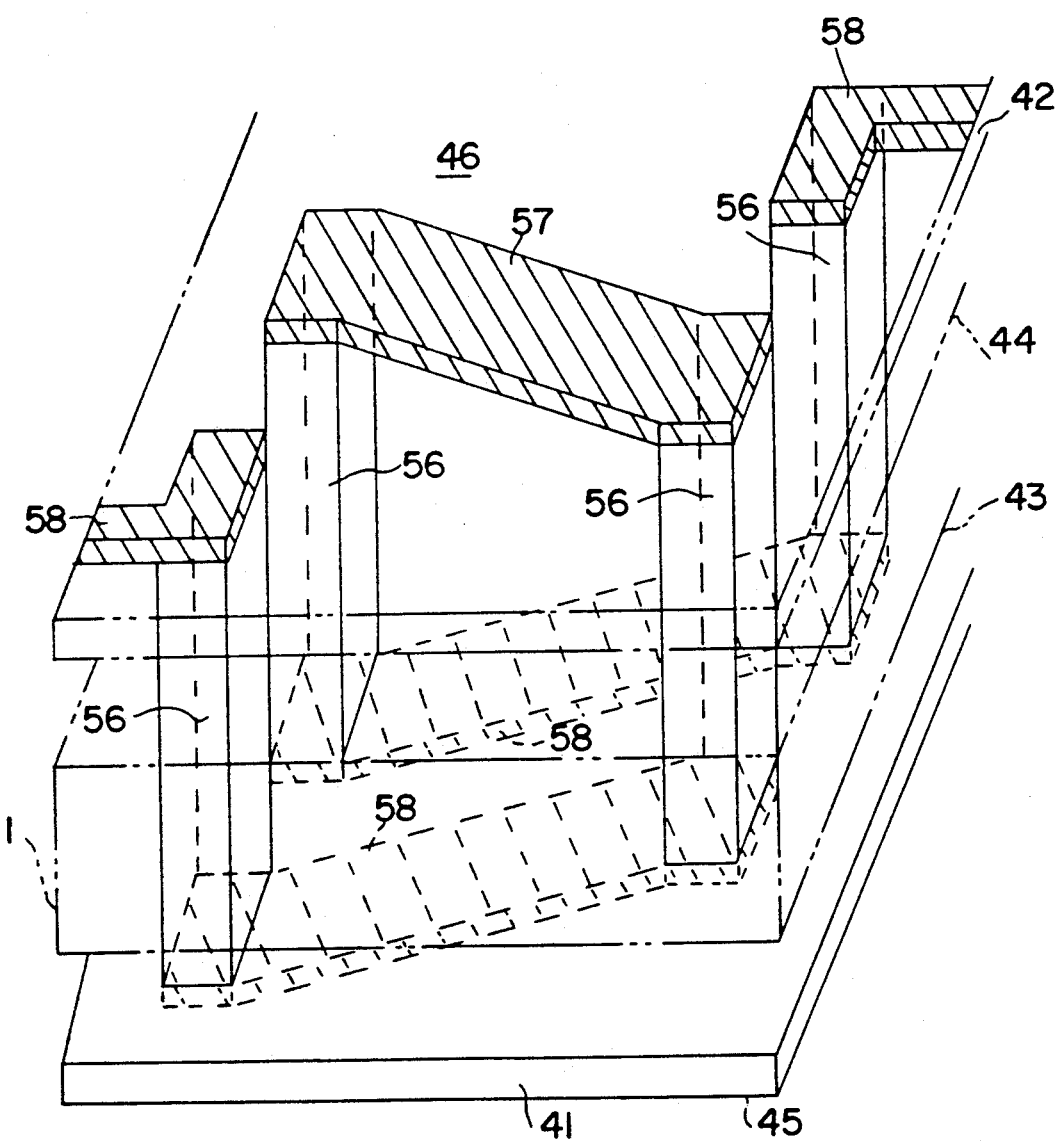
Figure 13E:
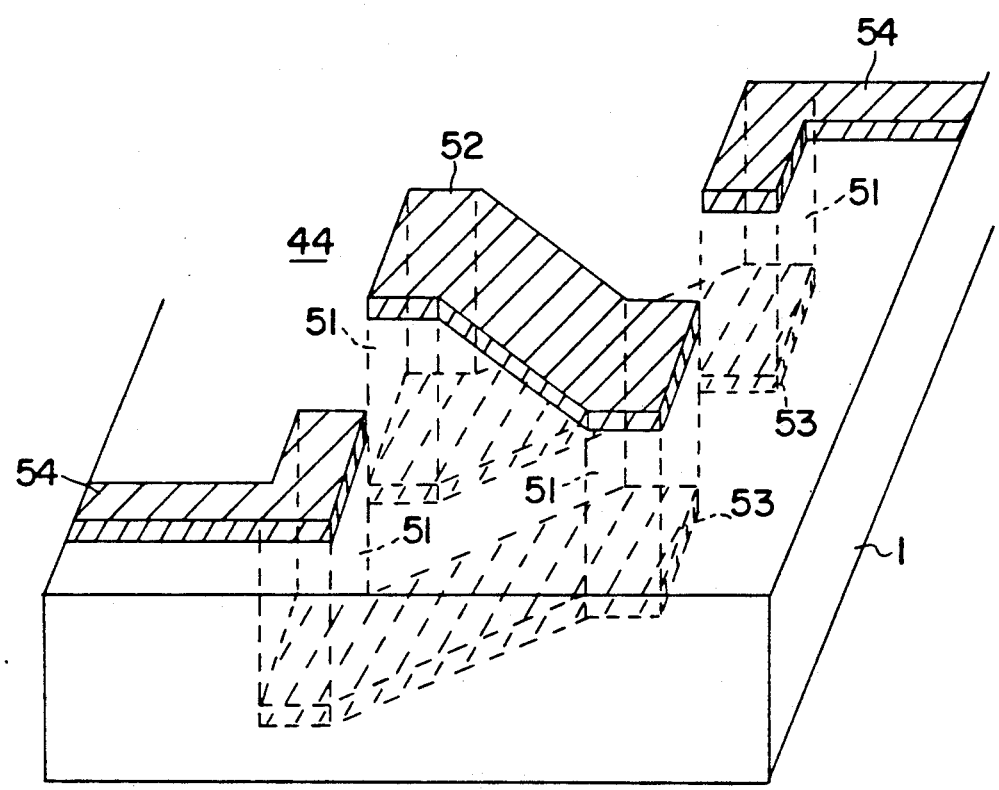

The helical structure 48 that surrounds helical structure 47 is most easily understood with respect to FIG. 13(d). FIG. 13(d) is an exploded view and omits the helical structure 47 for clarity. After the formation of helical structure 47, electrically insulating layers 41 and 42 are placed on the surfaces 43 and 44 of substrate 1. The insulating layers 41 and 42 cover the electrical conductors 53 and 52, respectively. Thereafter, electrically conducting vias 56 are produced, penetrating insulating layers 41 and 42 as well as substrate 1. Pairs of vias exposed at surface 45 of insulating layer 41 are electrically interconnected by electrical conductors 58. On surface 46 of electrically insulating layer 42, a conductor 57 interconnects two of the vias 56. Again, only one conductor 57 is shown, but, in other embodiments including more vias 56, additional conductors 57 would be employed. Electrical leads 58 disposed on surface 46 respectively contact one of the vias 56 to produce external leads for the structure. When these two helices are completed, the structure of FIG. 13(a) is obtained.

All of the steps in producing the transformer structure of FIG. 13(a) are conventional. The via holes can be produced by an isotropic etching, such as ion milling or reactive ion etching. The filling of the via holes with metal and the deposition and patterning of the electrical interconnections illustrated uses conventional technology. While helix 48 is shown surrounding helix 47, which maximizes the inductive coupling between the helices, it is not necessary that one coil completely surround the other or that the helices be coaxial. Moreover, portions or all of the insulating films 41 and 42 may be removed, leaving air bridge type structures in place.

Figure 14A:
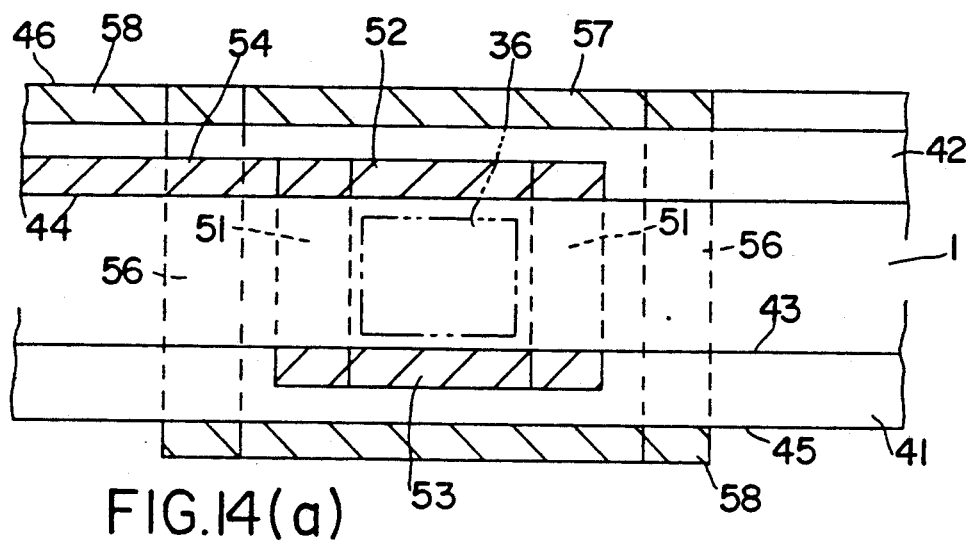
FIGS. 14(a) and 14(b) are two side views of a modification of the transformer of FIG. 13(a) according to an embodiment of the invention.
Figure 14B:
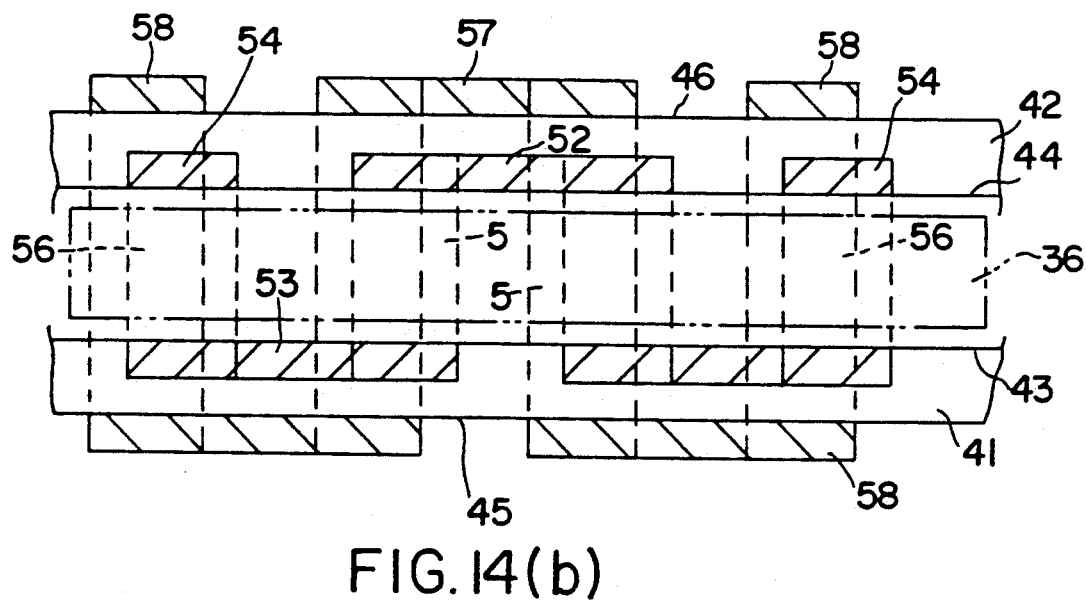

While the structure of FIG. 13(a) provides good mutual coupling between the helical structures since they are so closely spaced, the coupling can be increased by including a material having a relatively high magnetic permeability within the two helices. An example of such a transformer is illustrated in FIGS. 14(a) and 14(b) which are side views similar to FIGS. 13(b) and 13(c). In addition to the elements shown in FIGS. 13(b) and 13(c), in the embodiment of the invention illustrated in FIGS. 14(a) and 14(b), a magnetic material 36, such as a ferrite, is disposed within substrate 1 inside helix 47. Magnetic body 36 is not limited to a ferrite and may include other magnetic materials, such as iron, ferrosilicon, or an iron/nickel alloy, for example. The magnetic material is a solid body that is disposed within a recess formed in substrate 1 before the conductors 52 and 53 are deposited. Alternatively, the magnetic material could be disposed in a recess by silk screening or some other material deposition process followed by any necessary curing steps.

Figure 15A:
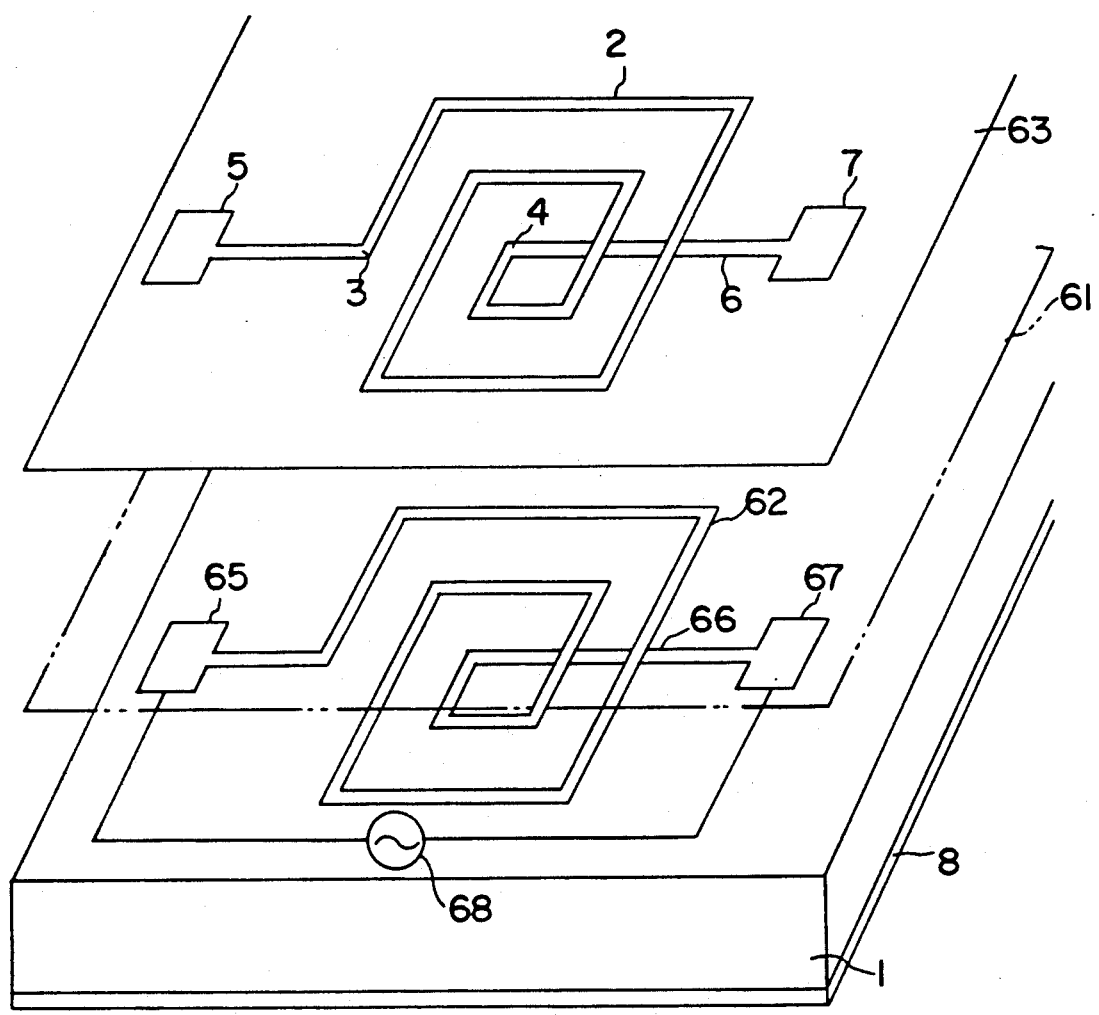
FIG. 15(a) is a perspective view of a variable inductance according to an embodiment of the invention.

In FIG. 15(a), a perspective view of a variable inductance according to another embodiment of the invention is shown. The variable inductance includes two similar spiral inductive structures, each similar to the prior art spiral shown in FIG. 1 of the application. A spiral 2 includes an electrical conductor disposed on an electrically insulating substrate 63 and a lead 6 in an air bridge structure connecting the internal end 4 of the spiral 2 to a terminal 7. The external end 3 of the spiral 2 is directly connected to a terminal 5. A similar spiral 62 with terminals 65 and 67 is disposed on a substrate 1. The two spirals 2 and 62 are separated by an electrically insulating film 61. The terminals 65 and 67 of spiral 62 are connected to an electrical signal source 68 that causes a current to flow through spiral 62. The phase and magnitude of that current flow varies the effective inductance of spiral 2 because of the mutual inductive coupling of the two spirals. An electrically conducting ground plane 8 is disposed on the surface of substrate 1 opposite that on which spiral 62 is disposed.

Figure 15B:
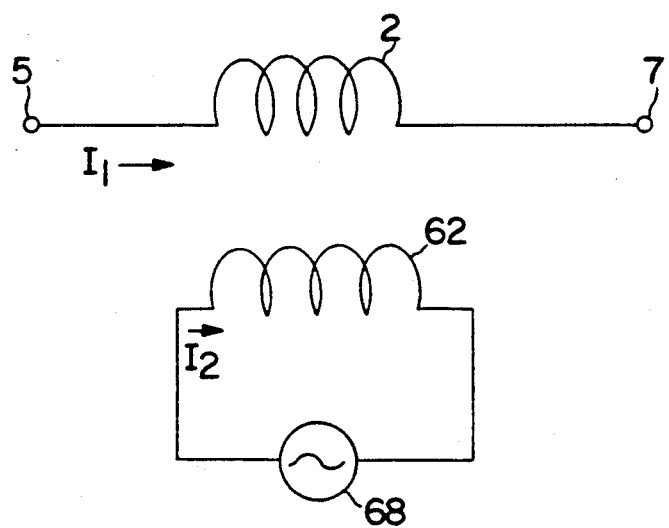
FIG. 15(b) is a schematic diagram of an equivalent circuit of the variable inductance of FIG. 15(a).

FIG. 15(b) is an equivalent circuit of the structure of FIG. 15(a). In FIG. 15(b), a current $I_1$ flows through spiral 2 and a current $I_2$ flows through spiral 62 because of the signal applied by signal source 68. The inductances of spirals 2 and 62 are $L_1$ and $L_2$, respectively, and voltages $V_1$ and $V_2$ appear across those coils. If the impedance of signal source 68 is $Z_0$ and the mutual inductance between the spirals is M, then $$V_1 = j\omega L_1 I_1 - j\omega M I_2$$
$$V_2 = j\omega L_2 I_2 - j\omega M I_1$$
$$V_2 = -Z_0 I_2.$$

The effective impedance $Z_1$ of spiral 2 is thus $$\begin{aligned} Z_1 &= V_1/I_1 \\ &= j\omega L_1 + j\omega(I_2/I_1)^2(Z_0 - j\omega L_2) \\ &= \omega^2(I_2/I_1)^2 L_2 + j\omega[L_1 + (I_2/I_1)^2 Z_0]. \end{aligned}$$

From these equations, it follows that:

$$j\omega M = (Z_0 - j\omega L_2)(I_2/I_1).$$

Since the inductances of the spirals $L_1$ and $L_2$ and the impedance of the signal source $Z_0$ are constant, it is apparent from the equations that the effective impedance of the spiral 2, $Z_1$, is a function of the currents $I_1$ and $I_2$ and can be varied by controlling $I_2$. The effective impedance of spiral 2 can also be increased or decreased depending upon the relative phases of the currents $I_1$ and $I_2$.

Alternatively, the two terminals of spiral 62 can be connected directly together without the presence of any signal source so that $Z_0$ is zero. In that case $$j\omega M = -j\omega L_2(I_2/I_1)$$

and $$V_1 = j\omega L_1 I_1 - j\omega L_1(I_2/I_1)^2.$$

In that case $$\begin{aligned} Z_1 &= V_1/I_1 \\ &= j\omega[L_1 - L_2(I_2/I_1)^2] \end{aligned}$$

so that the inductance of spiral 2 can be controlled depending upon the currents flowing through the two spirals.

Figure 16A:
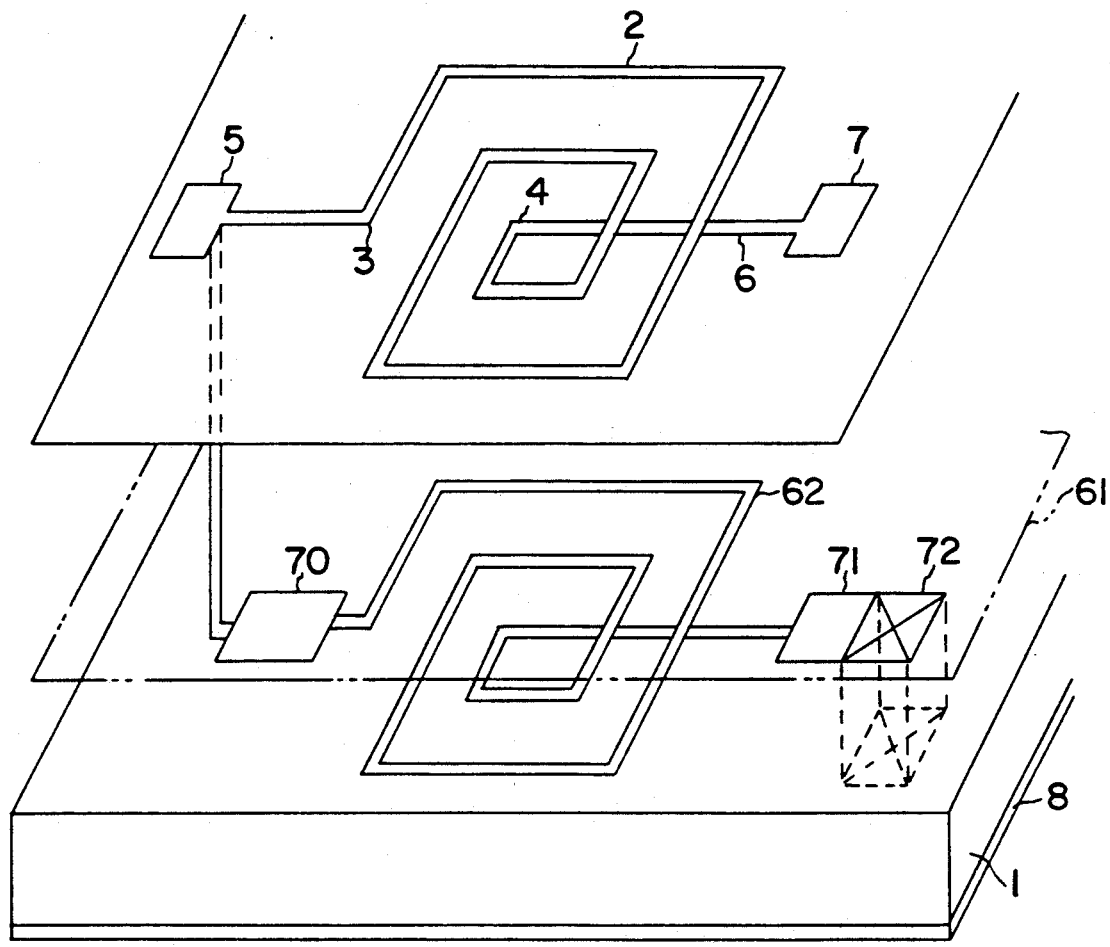
FIG. 16(a) is a perspective view of a variable inductance according to an embodiment of the invention.
Figure 16B:
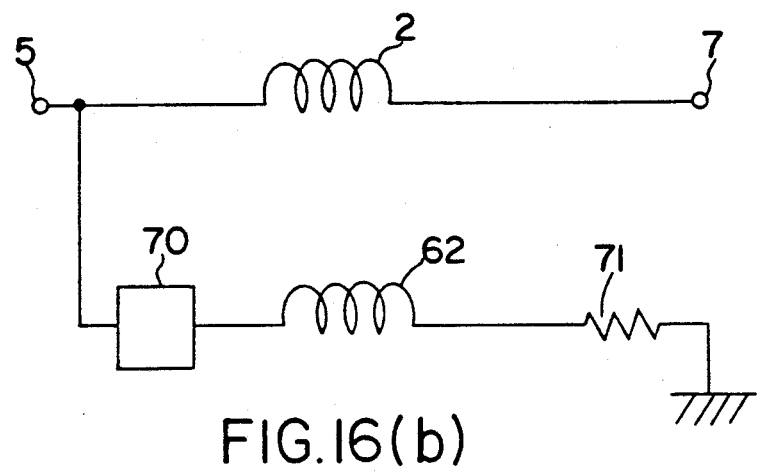
FIG. 16(b) is a schematic diagram of an equivalent circuit of the variable inductance of FIG. 15(a).

FIG. 16(a) shows a perspective view of a modification of the variable inductance structure of FIG. 15(a). In FIG. 16(a), terminal 5 of spiral 2 is connected through a via to the external end of spiral 62. A circuit 70 is connected in series with spiral 62 for varying the current flowing through spiral 62. Circuit 70 may be both an attenuator and an amplifier for decreasing and increasing the current flow through spiral 62. The other end of spiral 62 is connected through a termination 71 to the ground plane 8 by means of a via 72. An equivalent circuit of the structure of FIG. 16(a) is shown in FIG. 16(b). The current flowing in spiral 62 is controlled by circuit 70, thereby altering the effective inductance of spiral 2 in accordance with the equations set forth above. In particular, circuit 70 permits control of the ratio of current flows $I_2/I_1$, varying the impedance $Z_1$ of spiral 2. Depending upon the relative phases of the currents flowing through spirals 2 and 62, the effective inductance of spiral 2 can be increased or decreased.

Figure 17:
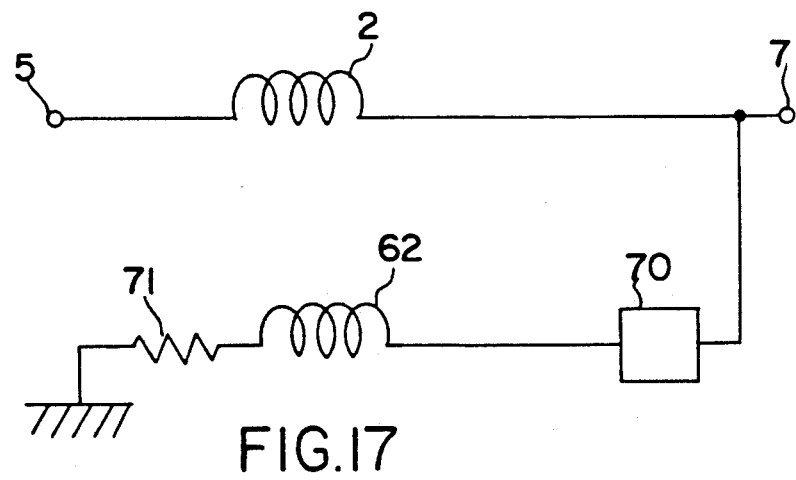
FIG. 17 is a schematic circuit diagram of a modification of the variable inductance of FIG. 16(a).

The connections of spiral 62 may be reversed as shown in the equivalent circuit of FIG. 17. In the embodiments shown in FIGS. 15(a) and 16(a), the spirals 2 and 62 are wound in the same direction. By winding one of the spirals 2 and 62 in the reverse direction from the other, the direction of change of the inductance of spiral 2 with current flowing in spiral 62 can be reversed as if the connections of spiral 62 were reversed, i.e., changed from those of FIG. 16(b) to those of FIG. 17. While the embodiments of the invention shown in FIGS. 15(a) and 16(a) both employ two layer structures including two spirals, additional layers including additional spiral inductors can also be employed.

The use of these novel additional inductors expands the range of variable inductance that can be achieved in an integrated circuit. In specific circuits requiring specific, fixed inductances, the prior art design practice has been to manufacture numerous circuits, repeatedly modifying their design in a trial and error technique to achieve the desired inductance based on measured performance. The final design is chosen based on these measurements. The variable inductance according to the invention avoids the trial and error technique since the effective inductance value can be easily adjusted after the circuit is fabricated.

Figure 18:
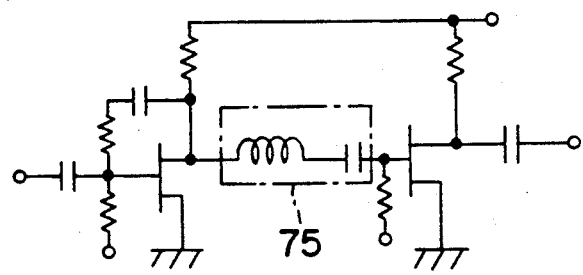
FIG. 18 is a schematic circuit diagram of a peaking circuit for a high frequency amplifier.
Figure 19:
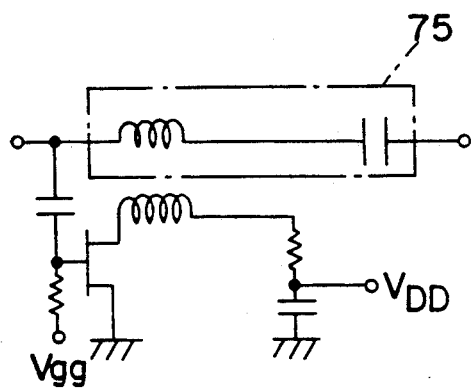
FIG. 19 is a schematic circuit diagram including circuitry for substitution in the peaking circuit of FIG. 18.

One practical use of a variable inductance according to the invention is illustrated in FIGS. 18-20. Generally, a wide band amplifier operating to frequencies as high as several Ghz employs a peaking circuit for tuning the frequency response of the amplifier at the upper end of the frequency range. An example of a peaking circuit is shown in FIG. 18 and includes two field effect transistors. Element 75 connected between the transistors is an inductance effectively connected in series with a capacitance that represents the parasitic capacitances. That element 75 is subject to the trial and error design technique to determine a precise design value for a particular circuit and frequency range. The effect of the value of the inductance of element 75 upon the frequency response of an amplifier is indicated in FIG. 20. If the inductance is reduced, the frequency range is extended or peaked.

The variable inductance circuit of FIG. 15(a) may be employed as shown in FIG. 19 as a substitute for element 75. By replacing the element 75 of FIG. 19 in the circuitry of FIG. 18, the inductance and peaking circuit response can be varied over a range. As a result, the frequency versus gain characteristic of an amplifier can be varied between the solid and broken lines shown in the graph of FIG. 20. Adjustments in the frequency response can be made during operation of the amplifier, if necessary, providing additional flexibility and avoiding the necessity of supplying different amplifiers for different frequency ranges.

Although the variable inductors of FIGS. 15(a) and 16(a) employ several insulating layers and at least two layers of metallizations, they are readily integrable with integrated circuits. The electrically insulating substrate 1 may be a semiconductor substrate in which active elements and passive elements are also disposed to form a monolithic circuit. As in the other embodiments of the invention, these inductors are integrable, not because they can be made on separate substrates that can be placed along side semiconductor substrates containing other circuit elements. The novel inductors are integrable because the very same substrate may include not only the novel inductive structures but also other circuit elements as well, all made by conventional integrated circuit processes.

We claim:

1. An inductive structure integrable with a semiconductor integrated circuit comprising:
   an electrically insulating substrate having opposed first and second surfaces;
   an electrical conductor disposed in a first spiral on the first surface of the substrate, the spiral including an external end disposed outside the spiral as a first lead and an internal end disposed within the spiral;
   first and second electrically conducting vias passing through the substrate from the first to the second surface, the first via intersecting and establishing an electrical connection to the internal end of the first spiral, the second via lying outside the spiral;
   an electrically conducting connector disposed on the second surface of the substrate electrically connecting the first and second vias; and
   a second lead disposed on the first surface of the substrate outside the first spiral electrically connected to the second via whereby electrical connections to the inductive structure can be made on the first surface of the substrate.

2. The inductive structure of claim 1 wherein the electrically conducting connector disposed on the second surface of the substrate is disposed in a second spiral.

3. The inductive structure of claim 2 wherein the second spiral, when projected onto the first surface of the substrate, is interleaved with the first spiral.

4. The inductive structure of claim 1 wherein the substrate is an electrically insulating semiconductor.

5. The inductive structure of claim 4 wherein the substrate is chosen from the group consisting of gallium arsenide and indium phosphide.

6. An inductive structure integrable with a semiconductor integrated circuit comprising:
   an electrically insulating substrate having opposed first and second surfaces;
   an electrical conductor disposed in a spiral spaced from the first surface of the substrate, the spiral including an external end disposed outside the spiral as a first lead and an internal end disposed within the spiral, said first spiral including at least two windings adjacent each other; and
   a plurality of electrically conducting, spaced apart posts disposed on the first surface of the substrate contacting and supporting the first spiral wherein each post supporting one winding is disposed intermediate two adjacent posts supporting an adjacent winding.

7. The inductive structure of claim 6 including first and second electrically conducting vias passing through the substrate from the first to the second surface, the first via intersecting and establishing an electrical connection to the internal end of the spiral;
   the second via lying outside the spiral;
   an electrically conducting connector disposed on the second surface of the substrate electrically connecting the first and second vias; and
   a second lead disposed on the first surface of the substrate outside the spiral electrically connected to the second via whereby electrical connections to the inductive structure can be made on the first surface of the substrate.

8. The inductive structure of claim 6 wherein the substrate is an electrically insulating semiconductor.

9. The inductive structure of claim 8 wherein the substrate is chosen from the group consisting of gallium arsenide and indium phosphide.

10. A transformer integrable with a semiconductor integrated circuit comprising:
    an electrically insulating semiconductor substrate having a first surface;
    a first electrical conductor disposed on the first surface of the substrate comprising a first winding having a first pair of leads;
    a first electrically insulating film disposed on the first electrical conductor;
    a second electrical conductor disposed on the electrically insulating film comprising a second winding having a second pair of leads, the first and second windings and the electrically insulating film including a common central opening wherein the pairs of leads of the first and second windings are oriented in different directions to minimize the coupling between the respective pairs of leads; and
    a magnetic material disposed on the surface of the substrate in the common central opening increasing the inductive coupling between the first and second windings.

11. The transformer of claim 10 wherein the magnetic material is a ferrite body.

12. The transformer of claim 10 wherein the electrically insulating film is chosen from the group consisting of SiN and SiON.

13. The transformer of claim 10 wherein the substrate is chosen from the group consisting of gallium arsenide and indium phosphide.

14. The transformer of claim 10 including a second electrically insulating film disposed on the second electrical conductor and a third electrical conductor disposed on the second electrically insulating film opposite the second electrical conductor comprising a third winding and a third pair of leads, the second electrically insulating film and the third electrical conductor having respective central openings aligned with the common central opening of the first and second windings.

15. A transformer integrable with a semiconductor integrated circuit comprising:
    an electrically insulating substrate having opposed first and second surfaces;
    a plurality of first electrically conducting vias passing through the substrate from the first to the second surface;
    at least one first and second electrical conductor respectively disposed on the first and second surfaces of the substrate, each of the first and second conductors electrically connecting two vias to form a first helical winding comprising the first and second electrical conductors and the first vias;
    first and second electrically conducting leads disposed on at least one of the first and second surfaces of the substrate respectively electrically connected to one of the first vias;
    first and second electrically insulating films disposed on the first and second surfaces of the substrate, respectively, at least partially covering the first and second electrical conductors and first and second leads;
    a plurality of second electrically conducting vias passing through the first and second electrically insulating films and the electrically insulating substrate;
    at least one third and fourth electrical conductor respectively disposed on the first and second electrically insulating films, each of the third and fourth conductors electrically connecting two of the second vias to form a second helical winding comprising the third and fourth electrical conductors and the second vias; and third and fourth electrically conducting leads disposed on at least one of the first and second electrically insulating films respectively electrically connected to one of the second vias.

16. The transformer of claim 15 wherein the electrically insulating substrate is an electrically insulating semiconductor.

17. The transformer of claim 15 wherein the substrate is chosen from the group consisting of gallium arsenide and indium phosphide.

18. The transformer of claim 15 wherein the second helical winding surrounds the first helical winding.

19. The transformer of claim 15 including a magnetic material disposed within the first helical winding increasing the inductive coupling between the first and second helical windings.

20. The transformer of claim 19 wherein the magnetic material is a ferrite body.

21. A two terminal variable inductance element integrable with a semiconductor integrated circuit comprising:

an electrically insulating substrate having opposed first and second surfaces;

a first electrical conductor disposed in a first spiral on the first surface of the substrate;

means for producing and controlling a variable electrical current flow through the first conductor;

an electrically insulating film disposed on the first surface and the first spiral; and a second electrical conductor having first and second terminals, disposed in a second spiral on the electrically insulating film, and inductively coupled to the first spiral, the first and second terminals of the second electrical conductor constituting the terminals of the two terminal variable inductance element whereby the inductance between the first and second terminals is controlled by the electrical current flow through the first electrical conductor.

22. The variable inductance element of claim 21 wherein the substrate is an electrically insulating semiconductor.

23. The variable inductance element of claim 22 wherein the substrate is chosen from the group consisting of gallium arsenide and indium phosphide.

24. A variable inductance element integrable with a semiconductor integrated circuit comprising:

an electrically insulating substrate having opposed first and second surfaces;

an electrical conductor disposed in a first spiral on the first surface of the substrate;

an electrically insulating film disposed on the first surface and the first spiral;

a second electrical conductor disposed in a second spiral on the electrically insulating film and inductively coupled to the first spiral, each of the first and second spirals having respective first and second ends;

an electrically conducting first via penetrating the electrically insulating film electrically connecting the first end of the first spiral to the first end of the second spiral; and an electrically conducting ground plane disposed on the second surface of the substrate and a second electrically conducting via passing through the substrate from the first to the second surface electrically connecting the second end of the first spiral to the ground plane.

25. The variable inductance element of claim 24 wherein the substrate is an electrically insulating semiconductor.

26. The variable inductance element of claim 25 wherein the substrate is chosen from the group consisting of gallium arsenide and indium phosphide.

27. The variable inductance element of claim 24 including means for controlling the flow of current through the second spiral serially connected to the first end of the second spiral and an electrical termination connected between the second end of the first spiral and the ground plane.

28. The variable inductance element of claim 27 wherein the means for controlling is selected from the group consisting of an attenuator and an amplifier.

* * * * *